United States Patent
Kawabe et al.

(10) Patent No.: US 7,595,362 B2
(45) Date of Patent: Sep. 29, 2009

(54) CURABLE RESIN COMPOSITION

(75) Inventors: Masanao Kawabe, Fukuoka (JP); Hiroyuki Yano, Chiba (JP); Yasuji Shichijo, Fukuoka (JP); Kouhei Tomari, Fukuoka (JP); Isamu Akiba, Fukuoka (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 615 days.

(21) Appl. No.: 10/586,642

(22) PCT Filed: Jan. 26, 2005

(86) PCT No.: PCT/JP2005/001020

§ 371 (c)(1), (2), (4) Date: Jul. 19, 2006

(87) PCT Pub. No.: WO2005/073264

PCT Pub. Date: Aug. 11, 2005

(65) Prior Publication Data

US 2007/0129502 A1 Jun. 7, 2007

(30) Foreign Application Priority Data

Jan. 30, 2004 (JP) ............................. 2004-024122

(51) Int. Cl.
*C08L 71/12* (2006.01)
*B32B 15/08* (2006.01)

(52) U.S. Cl. ..................... 525/132; 524/445; 524/449; 525/391; 526/336; 428/626

(58) Field of Classification Search ................. 525/132, 525/391; 526/336
See application file for complete search history.

(56) References Cited

U.S. PATENT DOCUMENTS 5,965,663 A * 10/1999 Hayase ....................... 524/609
6,835,785 B2 * 12/2004 Ishii et al. ................... 525/391
7,402,645 B2 * 7/2008 Kawabe ....................... 526/336
2001/0053450 A1   12/2001 Yeager et al.

FOREIGN PATENT DOCUMENTS

| EP | 0 106 023 | 4/1984 |
| JP | 59-12930 | 1/1984 |
| JP | 6-136075 | 5/1994 |
| JP | 6-179734 | 6/1994 |
| JP | 6-184213 | 7/1994 |
| JP | 2000-128908 | 5/2000 |
| JP | 2003-515642 | 5/2003 |
| JP | 2003-261743 | 9/2003 |
| JP | 2003-292570 | 10/2003 |
| WO | WO 2005073258 A1 * | 8/2005 |

* cited by examiner

*Primary Examiner*—Vickey Nerangis
(74) *Attorney, Agent, or Firm*—Edwards Angell Palmer & Dodge LLP

(57) ABSTRACT

Provided is curable resin composition which gives a cured article excellent in chemical resistance, dielectric properties, low water-absorption, heat resistance, flame retardance, and mechanical properties and which is usable in applications such as dielectric materials, insulating materials, heat-resistant materials, and structural materials. The curable resin composition includes a component (A) which is a polyphenylene ether oligomer having a number-average molecular weight of 700 to 4,000 and having a vinyl group at both end and a component (B) which is a solvent-soluble polyfunctional vinylaromatic copolymer which has structural units derived from monomers including a divinylaromatic compound (a) and an ethylvinylaromatic compound (b) and in which the content of repeating units derived from the divinylaromatic compound (a) is 20 mol % or higher, the ratio of the amount (wt. %) of the component (A) to that (wt. %) of the component (B) being (20 to 98):(2 to 80). The composition can further contain a layered silicate, a halogenated flame retardant, etc.

17 Claims, No Drawings

US 7,595,362 B2

CURABLE RESIN COMPOSITION

TECHNICAL FIELD

The present invention relates to a curable resin composition, to a film formed from the curable resin composition, to a curable composite material formed of the curable resin composition and a substrate, to a cured product of the curable composite material, to a laminate formed of the cured product and a metal foil, and to a copper foil provided with a resin.

BACKGROUND ART

Miniaturization and densification of a packaging method in a field of electronic devices for communication, consumer use, industry, and the like are significant in recent years, and excellent heat resistance, dimensional stability, and electrical properties are required for materials. For example, a printed wiring board conventionally employs a copper-clad laminate formed of a heat-curable resin such as a phenol resin or an epoxy resin as a material. Such a resin balances various properties but has a disadvantage of poor electrical properties, in particular, poor dielectric properties in a high frequency region. As a new material for solving the above-mentioned problem, polyphenylene ether has attracted attention recently and has been applied to a copper-clad laminate board and the like.

Polyphenylene ether refers to an engineering plastic having excellent mechanical properties and electrical properties and relatively high heat resistance. However, in the case where polyphenylene ether is to be used as material for a printed wiring board, the material is required to have very high solder heat resistance and intrinsic heat resistance of polyphenylene ether is not sufficient. That is, polyphenylene ether deforms in exposure to high temperatures of 200° C. or higher, to thereby cause significant reduction in mechanical strength or peeling of a copper foil formed as a circuit on a resin surface. Further, polyphenylene ether has high resistance to an acid, an alkali, and hot water but very low resistance to an aromatic hydrocarbon compound or a halogen-substituted hydrocarbon compound and dissolves in such a solvent.

As a method of improving heat resistance and chemical resistance of polyphenylene ether, there is proposed a method involving introducing a crosslinking functional group into a chain of polyphenylene ether, curing the whole, and using polyphenylene ether as cured polyphenylene ether. However, no satisfying solution has been obtained so far.

To be specific, in U.S. Pat. No. 3,281,393 and U.S. Pat. No. 3,422,062, cured polyphenylene ether is obtained by producing polyphenylene ether having an allyl group through copolymerization of 2-allyl-6-methylphenol and 2,6-dimethylphenol, and curing polyphenylene ether. However, polyphenylene ether having an allyl group has a melting temperature higher than a curing temperature, and thus it is impossible to perform heat forming such as vacuum lamination. As a method of improving such formability, use of a large amount of a plasticizer in combination has been attempted in U.S. Pat. No. 3,422,062, but the use of a plasticizer not only degrades excellent electrical properties (low dielectric constant and low dielectric dissipation factor) of polyphenylene ether and also leads to reduction in heat resistance and chemical resistance after curing.

Meanwhile, U.S. Pat. No. 4,634,742 discloses a method involving: obtaining curable polyphenylene ether by using a polymer of 2,6-dimethylphenol, and converting a methyl group into a vinyl group or introducing a vinyl group into a 3-- or 5- position of a phenyl group; and heat-curing the resultant. In this case, the vinyl group is bonded directly to an aromatic ring of polyphenylene ether without a curved carbon chain or an ether bond. Thus, polyphenylene ether after curing has insufficient flexibility and becomes a very brittle material which is not suitable for practical use.

Examples of the prior documents related to the present invention include the following.

Patent Document 1: JP-A-06-179734
Patent Document 2: JP-A-2003-261743
Patent Document 3: JP-A-2003-292570
Patent Document 4: JP-A-2000-128908

Another method of using polyphenylene ether involves mixing a curable polymer or monomer into a polyphenylene ether resin. Polyphenylene ether is used in combination with the curable polymer or monomer, to thereby improve chemical resistance of polyphenylene ether and obtain a material having excellent dielectric properties of polyphenylene ether. Examples of the curable polymer or monomer include: an epoxy resin; 1,2-polybutadiene; a polyfunctional maleimide; a polyfunctional cyanate; a polyfunctional acryloyl compound; and triallyl isocyanurate.

JP-A-06-179734 discloses a curable composite material formed of: a reaction product of polyphenylene ether and an unsaturated carboxylic acid or the like (a); diallylphthalate, divinylbenzene, a polyfunctional acryloyl compound, a poly functional methacryloyl compound, a polyfunctional maleimide, a polyfunctional cyanate, a polyfunctional isocyanate, an unsaturated polyester (b), or the like; a thermoplastic resin (c); and a substrate (d). JP-A-06-179734 discloses a use of divinylbenzene or a prepolymer thereof as the component (b), but examples only disclose use of a reaction product of polyphenylene ether, and an unsaturated carboxylic acid or an unsaturated carboxylic anhydride as the component (a) and a use of divinylbenzene as the component (b). A curable composition produced through this method has low compatibility between the component (a) and the component (b). Thus, a cured product obtained from the curable composition has disadvantages of insufficient heat resistance, appearance, chemical resistance, and mechanical properties, and has problems in an industrial use such as a narrow range of working conditions and varying mechanical properties of a product.

JP-A-2003-261743 and JP-A-2003-292570 each disclose a reactive polyphenylene ether oligomer having a cyanate group or an epoxy group on each terminal, but includes no description of an oligomer having a vinyl group. In JP-A-2003-261743 and JP-A-2003-292570, no synergetic effect of a reactive polyphenylene ether oligomer having a vinyl group on each terminal and a soluble polyfunctional vinyl aromatic copolymer has been imagined for developing excellent formability and favorable compatibility and providing a high performance curable resin composition. Further, JP-A-2000-128908 discloses a method of obtaining a styrene-based polymer from a polyfunctional vinyl compound, a polyfunctional chain transfer agent, and a styrene-based monomer. However, JP-A-2000-128908 discloses a method involving adding a polyfunctional vinyl compound in a low concentration of 2,000 ppm or less, and the method is solely appropriate for application of a thermoplastic resin. Thus, no production of soluble polyfunctional vinyl aromatic copolymer and application of a heat-curable resin have been imagined from the technique disclosed in JP-A-2000-128908, and JP-A-2000-128908 includes no description of mixing with a heat-curable resin for use.

Thus, no production of a curable resin composition formed of a reactive polyphenylene ether oligomer having a vinyl group on each terminal and a soluble polyfunctional vinyl aromatic polymer, having favorable formability based on a high level of fluidity, and having favorable compatibility through control of a molecular weight, a molecular weight distribution, and a copolymer composition has been imagined as a material solving various problems of conventional techniques and used in high technology fields.

DISCLOSURE OF THE INVENTION

Problems to be Solved by the Invention

An object of the present invention is to provide a resin composition, a cured product of the resin composition, or a material containing the resin composition each having excellent chemical resistance, dielectric properties, heat resistance and used for a dielectric material, an insulating material, or a heat resistant material in fields of electronics industry, aerospace industry, and the like. Another object of the present invention is to provide a resin composition, a cured product of the resin composition, or a material containing the resin composition having excellent flame retardance in addition to the above-mentioned properties.

MEANS FOR SOLVING THE PROBLEMS

The present invention relates to a curable resin composition including:

a component (A) which is a polyphenylene ether oligomer having a number average molecular weight Mn of 700 to 4,000, having a vinyl group on both terminal, and represented by the formula (1):

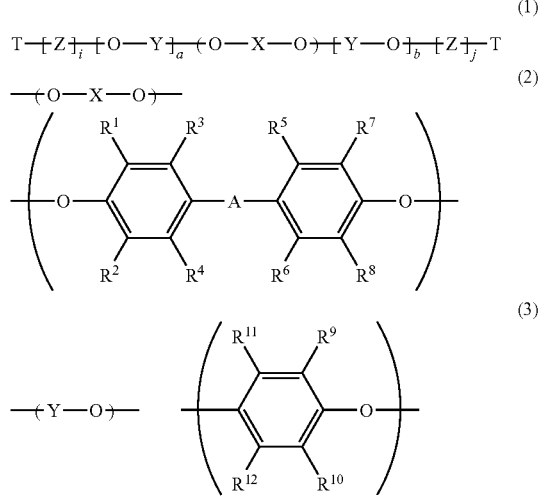

wherein: —(O—X—O)— is represented by the formula (2); $R^1$, $R^2$, $R^7$, and $R^8$ each represent a halogen atom, an alkyl group, or a phenyl group having 6 or less carbon atoms, or a phenyl group which may be identical to or different from each other; $R^3$, $R^4$, $R^5$, and $R^6$ each represent a hydrogen atom, a halogen atom, an alkyl group having 6 or less carbon atoms, or a phenyl group which may be identical to or different from each other; A represents a single bond or a linear, branched, or cyclic hydrocarbon group having 20 or less carbon atoms;

—(Y—O)— represents one or more structures represented by the formula (3); $R^9$ and $R^{10}$ each represent a halogen atom, an alkyl group having 6 or less carbon atoms, or a phenyl group which may be identical to or different from each other; $R^{11}$ and $R^{12}$ each represent a hydrogen atom, a halogen atom, an alkyl group having 6 or less carbon atoms, or a phenyl group which may be identical to or different from each other; Z represents an organic group which has one or more carbon atoms and which may have an oxygen atom; T represents a vinyl group; a and b each represent an integer of 0 to 20 and at least one of a and b is not 0; and i and j each independently represent an integer of 0 or 1; and a component (B) which is a solvent-soluble polyfunctional vinyl aromatic copolymer having structural units derived from monomers each formed of a divinyl aromatic compound (a) and an ethylvinyl aromatic compound (b), having a repeating unit derived from the divinyl aromatic compound (a) of 20 mol % or more, having a mole fraction of structural units having a vinyl group derived from the divinyl aromatic compound (a) and represented by the following formulae (a1) and (a2):

wherein, $R^{13}$ represents an aromatic hydrocarbon group having 6 to 30 carbon atoms;

wherein: $R^{14}$ represents an aromatic hydrocarbon group having 6 to 30 carbon atoms. The mole fraction satisfies the expression $(a1)/[(a1)+(a2)] \geq 0.5$, having a number average molecular weight (Mn) measured through gel permeation chromatography (GPC) of 600 to 30,000 in polystyrene equivalents, and having a ratio (Mw/Mn) of a weight average molecular weight (Mw) and the number average molecular weight (Mn) of 20.0 or less. The curable resin composition is characterized in that: a mixing amount of the component (A) is 20 to 98 wt % with respect to a total amount of the component (A) and the component (B); and a mixing amount of the component (B) is 2 to 80 wt % with respect to a total amount of the component (A) and the component (B).

The component (B) preferably has an indan structure represented by the following general formula (4) in a main chain skeleton of the polyfunctional vinyl aromatic copolymer having structural units derived from monomers each formed of a divinyl aromatic compound (a) and an ethylvinyl aromatic compound (b):

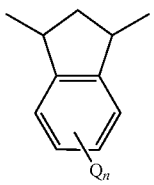

(4)

wherein: Q represents a saturated or unsaturated aliphatic hydrocarbon group, an aromatic hydrocarbon group, an aromatic ring condensed to a benzene ring, or a substituted aromatic ring; and n represents an integer of 0 to 4). Further, the component (B) is preferably a soluble polyfunctional vinyl aromatic copolymer having a structural unit derived from a monovinyl aromatic compound (c) except the ethylvinyl aromatic compound (b) in the polyfunctional vinyl aromatic copolymer having structural units derived from monomers each formed of a divinyl aromatic compound (a) and an ethylvinyl aromatic compound (b).

The present invention relates to a curable resin composition further including a component (C) which is a thermoplastic resin in addition to the component (A) and the component (B), in which a mixing amount of the component (C) is 2 to 60 wt % with respect to a total amount of the component (A), the component (B), and the component (C). The thermoplastic resin as the component (C) is preferably one or more kinds of thermoplastic resins selected from the group consisting of a block copolymer having a polymer segment with a glass transition temperature of 20° C. or lower, and polyphenylene ether.

The present invention relates to a curable resin composition further including a component (D) which is a thermosetting resin in addition to the component (A), the component (B), and the component (C), in which a mixing amount of the component (D) is 2 to 40 wt % with respect to a total amount of the component (A), the component (B), the component (C), and the component (D). The heat-curable resin as the component (D) is preferably one or more kinds of thermosetting resins selected from the group consisting of heat-curable polyphenylene ether, a polyphenylene ether oligomer having a functional group on each terminal different from the functional group of the component (A), and a polyfunctional epoxy compound.

The present invention relates to a curable resin composition further including a component (E) which is a filler in addition to the component (A), the component (B), the component (C), and the component (D), in which a mixing amount of the component (E) is 2 to 90 wt % with respect to a total amount of the component (A), the component (B), the component (C), the component (D), and the component (E).

The present invention relates to a curable resin composition further including a component (J) which is a layered silicate in addition to the component (A), the component (B), the component (C), the component (D), and the component (E), in which a mixing amount of the component (J) is 0.1 to 98 wt %.

The present invention relates to a flame retardant curable resin composition, characterized by including a component (J) which is a layered silicate and a component (K) which is a halogenated flame retardant in addition to the component (A), the component (B), the component (C), the component (D), and the component (E), in which: a mixing amount of the component (J) is 0.1 to 95.9 wt %; and a mixing amount of the component (K) is 0.1 to 95.9 wt %.

The present invention relates to a film which is obtained by forming the curable resin composition into a film. The present invention relates to a resin coated metal foil including a film formed of the curable resin composition on one side of a metal foil.

The present invention relates to a curable composite material including the curable resin composition and a substrate, characterized in that the substrate is included in a ratio of 5 to 90 wt %, or to a cured composite material which is obtained by curing the curable composite material. The present invention relates to a laminate characterized by including a layer of the cured composite material and a metal foil layer.

Hereinafter, detailed description of the present invention will be given.

Description will be given of a polyphenylene ether oligomer having a vinyl group on each terminal (hereinafter, referred to as bifunctional OPE-2Vn) characteristically used as the component (A) in the present invention. The above-mentioned bifunctional OPE-2Vn is obtained through a reaction of: a polyphenylene ether oligomer (hereinafter, referred to as bifunctional OPE) obtained through oxidation copolymerization of a dihydric phenol and a monohydric phenol and represented by a formula (8); and a chloromethylstyrene, glycidyl methacrylate, glycidyl acrylate, or the like.

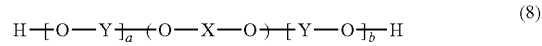

(8)

In the bifunctional OPE represented by the formula (8), —(O—X—O)— is represented by the formula (2), and —(Y—O)— represents one or more structures represented by the formula (3). In the formulae, $R^1$, $R^2$, $R^7$, $R^8$, $R^9$, and $R^{10}$ each represent a halogen atom, an alkyl group having 6 or less carbon atoms, or a phenyl group which may be identical to or different from each other; $R^3$, $R^4$, $R^5$, $R^6$, $R^{11}$, and $R^{12}$ each represent a hydrogen atom, a halogen atom, an alkyl group having 6 or less carbon atoms, or a phenyl group which may be identical to or different from each other; A represents a linear, branched, or cyclic hydrocarbon group having 20 or less carbon atoms; and a and b each represent an integer of 0 to 20 and at least one of a and b is not 0. Preferably, in —(O—X—O)—, $R^1$, $R^2$, $R^7$, and $R^8$ each represent a methyl group and $R^3$, $R^4$, $R^5$, and $R^6$ each represent a hydrogen atom. —(Y—O)— desirably has a structure represented by a formula (9), a structure represented by a formula (10), or a structure in which the formula (9) and the formula (10) are randomly arranged.

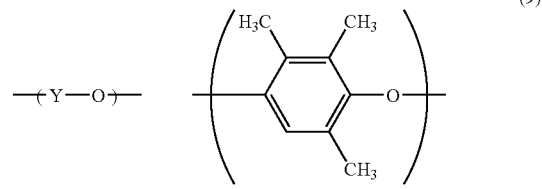

(9)

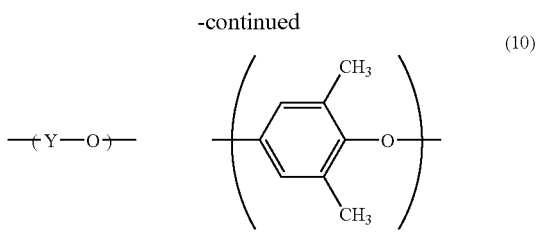

The bifunctional OPE represented by the formula (8) may be efficiently produced through oxidation polymerization of a dihydric phenol represented by a formula (11) and a single substance or a mixture of a monohydric phenol represented by a formula (12) in a toluene/alcohol or ketone solvent.

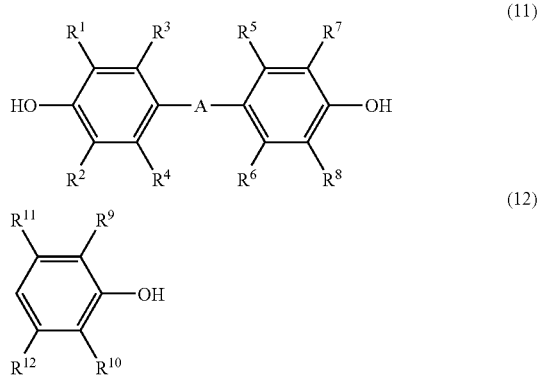

Note that A and $R^1$ to $R^{12}$ in the formulae (11) and (12) are defined the same as those described above.

Examples of the dihydric phenol represented by the formula (11) in which it is indispensable that $R^1$, $R^2$, $R^7$, and $R^8$ are not hydrogen atoms include, but are not limited to, 4,4'-methylenebis(2,6-dimethylphenol), 4,4'-(1-methylethylidene)bis(2,6-dimethylphenol), 4,4'-methylenebis(2,3,6-trimethylphenol), 4,4'-cyclohexylidenebis(2,6-dimethylphenol), 4,4'-(phenylmethylene)bis(2,3,6-trimethylphenol), 4,4'-[1,4-phenylenebis(1-methylethylidene)]bis(2,6-dimethylphenol), 4,4'-methylenebis[2,6-bis(1,1-dimethylethyl)phenol], 4,4'-cyclopentylidenebis(2,6-dimethylphenol), 4,4'-(2-furylmethylene)bis(2,6-dimethylphenol), 4,4'-(1,4-phenylenebismethylene)bis(2,6-dimethylphenol), 4,4'-(3,3,5-trimethylcyclohexylidene)bis(2,6-dimethylphenol), 4,4'-[4-(1'-methylethyl)cyclohexylidene]bis(2,6-dimethylphenol), 4,4'-(4-methylphenylethylene)bis(2,3,6-trimethylphenol), 4,4'-(1,4-phenylenebismethylene)bis(2,3,6-trimethylphenol), 4-[1-[4-(4-hydroxy-3,5-dimethylphenyl)-4-methylcyclohexyl]-1-methylethyl]-2,6-dimethylphenol, 4,4'-(4-methoxyphenylmethylene)bis(2,3,6-trimethylphenol), 4,4'-[4-(1-methylethyl)phenylmethylene]bis(2,3,6-trimethylphenol), 4,4'-(9H-fluoren-9-ylidene)bis(2,6-dimethylphenol), 4,4'-[1,3-phenylenebis(1-methylethylidene)]bis(2,3,6-trimethylphenol), 4,4'-(1,2-ethanediyl)bis[2,6-di-(1,1-dimethylethyl)phenol], and 5,5'-(1-methylethylidene)bis[3-(1,1-dimethylethyl)-1,1-biphenyl-2-ol].

Preferred examples of the monohydric phenol represented by the formula (12) include: a single substance of a monohydric phenol having substituents in 2- and 6-positions; and a mixture of a monohydric phenol having substituents in 2- and 6-positions and a monohydric phenol having substituents in a 3-position or in 3- and 5-positions. More preferred examples of the monohydric phenol represented by the formula (12) include: a single substance such as 2,6-dimethylphenol or 2,3,6-trimethylphenol; and a mixture of 2,6-dimethylphenol and 2,3,5-trimethylphenol.

Examples of an oxidation method include: a method directly using oxygen gas; and a method using air. Another example thereof is a method involving electrode oxidation. Any method may be employed, and the method is not particularly limited. Air oxidation is preferred in view of safety and inexpensive facility investment.

Examples of the catalyst which can be used in a case where oxidation polymerization are carried out using oxygen gas or air include one or two or more kinds of cuprates such as CuCl, CuBr, $Cu_2SO_4$, $CuCl_2$, $CuBr_2$, $CuSO_4$, and CuI. In addition to the above-mentioned catalysts, one or two or more kinds of amines such as monomethylamine and dimethylamine, monoethylamine and diethylamine, monopropylamine and dipropylamine, mono-n-butylamine and di-n-butylamine, mono-sec-dipropylamine and di-sec-dipropylamine, monobenzylamine and dibenzylamine, monocyclohexylamine and dicyclohexylamine, monoethanolamine and diethanolamine, ethylmethylamine, methylpropylamine, butyldimethylamine, allylethylamine, methylcyclohexylamine, morpholine, methyl-n-butylamine, ethylisopropylamine, benzylmethylamine, octylbenzylamine, octylchlorobenzylamine, methyl(phenylethyl)amine, benzylethylamine, N-n-butyldimethylamine, N,N'-di-tert-butylethylenediamine, di(chlorophenylethyl)amine, 1-methylamino-4-pentene, pyridine, methylpyridine, 4-dimethylaminopyridine, piperidine, and the like can be used in combination. The catalyst is not limited to those as long as is a cuprate or an amine.

Examples of the reaction solvent which can be used in combination with the catalyst include alcohol-based solvents or ketone-based solvents in addition to aromatic hydrocarbon-based solvents such as toluene, benzene, and xylene, and hydrocarbon halide-based solvents such as methylene chloride, chloroform, and carbon tetrachloride. Examples of the alcohol-based solvent include methanol, ethanol, butanol, propanol, methyl propylene diglycol, diethylene glycol ethyl ether, butyl propylene glycol, and propylpropylene glycol. Examples of the ketone-based solvent include acetone, methyl ethyl ketone, diethyl ketone, methyl butyl ketone, and methyl isobutyl ketone. Others include, but are not limited to, tetrahydrofuran, dioxan, and the like.

A reaction temperature is not particularly limited but is preferably 25 to 50° C. Oxidation polymerization is an exothermic reaction, and thus temperature control and molecular weight control involve difficulties at a reaction temperature of 50° C. or higher. At a reaction temperature of 25° C. or lower, a reaction rate extremely slows down to inhibit efficient production.

The bifunctional OPE-2Vn is represented by the formula (1). That is, —(O—X—O)— is represented by the formula (2), and —(Y—O)— is represented by the formula (3).

Z may represent an organic group which has one or more carbon atoms and which may have an oxygen atom. Examples of Z include —(—$CH_2$—)—, —(—$CH_2$—$CH_2$—)—, and —(—$CH_2$—Ar—)—, but Z is not limited to the examples. Examples of an addition method include: a method involving directly adding to the bifunctional OPE represented by the formula (8); and a method involving using a halide having a long carbon chain in derivative synthesis. However, the addition method is not limited to the examples.

Hereinafter, description will be given of a derivative prepared from the bifunctional OPE represented by the formula (8), which is a simplest structure, for clarity. For production of bifunctional OPE-2Vn, the bifunctional OPE represented by the formula (8) may be used as a powder separated from a reaction liquid or as a solution dissolved in the reaction liquid.

A method of producing the bifunctional OPE-2Vn to be used as the component (A) of the curable resin composition of the present invention is explained. The bifunctional OPE-2Vn can be synthesized through a reaction of a compound having a phenolic hydroxyl group on each terminal and represented by the formula (8), and chloromethylstyrene, glycidyl methacrylate, glycidyl acrylate, or the like. Preferred examples of a reactive compound to be used for introducing a vinyl group in synthesis of the bifunctional OPE-2Vn include chloromethylstyrene, and a chloromethylstyrene derivative having 1 to 7 substituents each having 1 to 30 carbon atoms from the viewpoints of dielectric properties and heat resistance of a cured product of a theromosetting resin composition of the present invention. A most preferred example thereof is chloromethylstyrene from the viewpoints of economical efficiency and availability of a raw material. A reaction temperature is preferably between −10° C. and 110° C.

A number average molecular weight Mn of the bifunctional OPE-2Vn falls within a range of 700 to 4,000. Mn of more than 4,000 undesirably increases a melt viscosity of the resin composition, leading to degradation of not only formability but also compatibility with another resin component such as the component (B). Further, such Mn may undesirably lead to degradation of film appearance and physical properties. In contrast, Mn of less than 700 degrades mechanical strength and heat resistance. The bifunctional OPE-2Vn has a low melt viscosity, favorable fluidity, and excellent compatibility with a polyfunctional vinyl aromatic copolymer. Further, the bifunctional OPE-2Vn has a vinyl group on each terminal and thus provides a resin composition with favorable strength and heat resistance and a cured product of the resin composition with excellent strength under heating. As a result, formation of cracks in exposure to high temperatures such as in soldering can be prevented.

The soluble polyfunctional vinyl aromatic copolymer to be used as the component (B) of the curable resin composition of the present invention has structural units derived from monomers each formed of a divinyl aromatic compound (a) and an ethylvinyl aromatic compound (b), has a repeating unit derived from the divinyl aromatic compound (a) of 20 mol % or more, has a mole fraction of structural units derived from the divinyl aromatic compound (a) and represented by the following formulae (a1) and (a2) satisfying the expression (a1)/[(a1)+(a2)]≧0.5, has Mn and Mw/Mn calculated by standard polystyrene samples with narrow molecular weight distribution measured through gel permeation chromatography (GPC) satisfying 600≦Mn≦30,000 and Mw/Mn≦20.0.

The curable resin composition of the present invention includes the component (A) and the component (B) as essential ingredients. A mixing amount of the component (A) is 30 to 98 wt % and a mixing amount of the component (B) is 2 to 70 wt % with respect to a total amount of the component (A) and the component (B).

The soluble polyfunctional vinyl aromatic copolymer to be used as the component (B) of the curable resin composition of the present invention not only has favorable dielectric properties derived from its molecular structure but also is used as a component solving the problems regarding formability such as low reactivity of a polyphenylene ether oligomer having a vinyl group on both terminal and further enhancing heat resistance. Thus, it is advantageous from the viewpoint of further enhancing heat resistance that in the curable resin composition of the present invention, the component (B) have an indan structure represented by the general formula (4) in a main chain skeleton of the polyfunctional vinyl aromatic copolymer having structural units derived from monomers each formed of a divinyl aromatic compound (a) and an ethylvinyl aromatic compound (b).

It is preferred from the viewpoint of improving compatibility with a polyphenylene ether-based resin that the component (B) be a soluble polyfunctional vinyl aromatic copolymer having a structural unit derived from a monovinyl aromatic compound (c) except the ethylvinyl aromatic compound (b) in the polyfunctional vinyl aromatic copolymer having structural units derived from monomers each formed of a divinyl aromatic compound (a) and an ethylvinyl aromatic compound (b).

This copolymer has structural units represented by the formulae (a1), (a2), and (4) as repeating units derived from the divinyl aromatic compound (a). $R^{13}$, $R^{14}$, Q, and n in the structural units represented by the formulae (a1), (a2), and (4) are defined the same as those described above, but a ratio of each structural unit in the copolymer is determined in accordance with reaction conditions including the kinds of the divinyl aromatic compound (a) and ethylvinyl aromatic compound (b) to be used, a reaction catalyst, and the reaction temperature.

Examples of the divinyl aromatic compound (a) which can be used herein include, but not limited to, m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl-4-ethyl-4'-propylbiphenyl.

Each of those compounds can be used alone, or two or more kinds of them can be used in combination.

Preferred specific examples of the divinyl aromatic compound (a) include divinylbenzene (including both m- and p-isomers), divinylbiphenyl (including all isomers), and divinylnaphthalene (including all isomers) from the viewpoints of cost and heat resistance of a polymer to be obtained. More preferred specific examples thereof include divinylbenzene (including both m- and p-isomers) and divinylbiphenyl (including all isomers). In particular, a most preferred example thereof is divinylbenzene (including both m- and p-isomers). In a field requiring a high level of heat resistance, in particular, divinylbiphenyl (including all isomers) and divinyinaphthalene (including all isomers) are preferably used.

In the polyfunctional vinyl aromatic copolymer, examples of the ethylvinyl aromatic compound which can be used as the component (b) which give structural units adjusting compatibility with a polyphenylene oligomer having vinyl groups on each terminal which is the components (A) and improving solvent-solubility and workability include, but not limited to, o-ethylvinyl benzene, m-ethylvinyl benzene, p-ethylvinyl benzene, 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4-ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene. Those can be used alone, two or more kinds thereof may be used in combination. Introduction of a structural unit derived from the component (b) into a polyfunctional vinyl aromatic copolymer can not only inhibit gelation of a copolymer and enhance solvent-solubility but also improve mechanical characteristics such as stretch at tensile break of the curable resin composition of the present invention. Preferred specific examples thereof include ethylvinylbenzene (including both m- and p-isomers) and ethylvinylbiphenyl (including all isomers) from the viewpoints of cost, prevention of gelling, and heat resistance of a polymer to be obtained.

Another monovinyl aromatic compound (c) except the ethylvinyl aromatic compound (b) may be added for enhancing heat resistance of a cured product of the curable resin composition of the present invention or improving compatibility with another resin. Examples of the other monovinyl aromatic compound (c) include: nuclear alkyl-substituted styrene excluding styrene and an ethylvinyl aromatic compound; a nuclear alkyl-substituted aromatic vinyl compound excluding an ethylvinyl aromatic compound; α-alkyl-substituted styrene; an α-alkyl-substituted aromatic vinyl compound; β-alkyl-substituted styrene; alkoxy-substituted styrene; an indene derivative; and an acenaphthylene derivative.

Examples of the nuclear alkyl-substituted styrene which can be used herein include alkyl-substituted styrenes such as methylstyrene, ethylstyrene, and butylstyrene.

Also, examples of the alkoxy-substituted styrene which can be used herein include alkoxystyrenes such as methoxystyrene, ethoxystyrene, and butoxystyrene. Others such as phenoxystyrene also can be used.

Examples of the aromatic vinyl compound which can be used herein include 2-vinylbiphenyl, 3-vinylbiphenyl, 4-vinylbiphenyl, 1-vinylnaphthalene, and 2-vinylnaphthalene.

Examples of the nuclear alkyl-substituted aromatic vinyl compound which can be used herein include vinyl-propylbiphenyl, and vinyl-propylnaphthalene.

Also, examples of the α-alkyl-substituted styrene which can be used herein include α-methylstyrene and α-ethylstyrene.

Examples of the indene derivative other than indene which can be used herein include alkyl-substituted indene such as methylindene, ethylindene, propylindene, and butylindene. Alkycocyindene such as methoxyindene, ethoxyindene, putoxyindene, or butoxyindene, and the like also can be used.

Examples of the acenaphthylene derivative other than acenaphthylene include: alkylacenaphthylenes such as methylacenaphthylene and ethylacenaphthylene; acenaphthylene halides such as chloroacenaphthylene and bromoacenaphthylene; and phenylacenaphthylenes.

The monovinyl aromatic compound (b) is not limited to those exemplified above. Further, the monovinyl aromatic compound (b) may be used alone, or two or more kinds thereof may be used in combination.

In the soluble polyfunctional vinyl aromatic copolymer, the monovinyl aromatic compound as the component (c) is not limited to the examples. The monovinyl aromatic compound (c) may be used alone, or two or more kinds thereof may be used in combination. Of the monovinyl aromatic compounds exemplified as the component (c), styrene, α-alkyl-substituted styrene, and an α-alkyl-substituted aromatic vinyl compound are preferred in view of large production of an indan structure in a skeleton of the copolymer in polymerization. Most preferred specific examples of the monovinyl aromatic compound as the component (c) include styrene, α-methylstyrene, and 4-isopropenylbiphenyl in view of cost and heat resistance of a polymer to be obtained.

In the soluble polyfunctional vinyl aromatic copolymer, the divinyl aromatic compound as the component (a) is used in an amount of 20 to 99.5 mol %, preferably 30 to 99 mol % or more, more preferably 40 to 95 mol % or more, and particularly preferably 50 to 85 mol % or more with respect to a total amount of monomers each formed of the component (a), the component (b), or the component (c). An amount of the divinyl aromatic compound (a) of less than 20 mol % undesirably tends to degrade heat resistance in curing of the produced soluble polyfunctional vinyl aromatic copolymer.

In the soluble polyfunctional vinyl aromatic copolymer, the ethylvinyl aromatic compound as the component (b) is used in an amount of 0.5 to 80 mol %, preferably 1 to 70 mol %, more preferably 5 to 60 mol %, and particularly preferably 15 to 50 mol % with respect to a total amount of monomers each formed of the component (a), the component (b), or the component (c). An amount of the ethylvinyl aromatic compound (b) of 80 mol % or more undesirably tends to degrade heat resistance in curing of the produced soluble polyfunctional vinyl aromatic copolymer.

In the soluble polyfunctional vinyl aromatic copolymer, the monovinyl aromatic compound as the component (c) is used in an amount of less than 40 mol %, preferably less than 30 mol %, more preferably less than 25 mol %, and particularly preferably less than 20 mol % with respect to a total amount of monomers each formed of the component (a), the component (b), or the component (c). An amount of the ethylvinyl aromatic compound (b) of 40 mol % or more undesirably tends to degrade heat resistance in curing of the produced soluble polyfunctional vinyl aromatic copolymer.

In the soluble polyfunctional vinyl aromatic copolymer, a mole fraction of structural units having a vinyl group, derived from the divinyl aromatic compound (a) and represented by the formulae (a1) and (a2) must satisfy the expression (a1)/[(a1)+(a2)]$\geq$0.5. The mole fraction thereof is preferably 0.7 or more, and particularly preferably 0.9 or more. A mole fraction thereof of less than 0.5 undesirably degrades heat resistance of a cured product of the produced copolymer and requires a long period of time for curing.

The soluble polyfunctional vinyl aromatic copolymer must have an indan structure represented by the general formula (4) in a main chain skeleton of the polyfunctional vinyl aromatic copolymer. In the general formula (4), Q represents an unsaturated aliphatic hydrocarbon group such as a vinyl group, an aromatic hydrocarbon group such as a phenyl group, or hydrocarbon group-substituted products thereof. 0 to 4 hydrocarbon groups may be substituted. Q may represent a divalent hydrocarbon group having an indan structure and capable of forming a condensed ring with a benzene ring to form a naphthalene ring or the like, and the divalent hydrocarbon group may have a substituent.

The indan structure represented by the general formula (4) is a structural unit for further enhancing heat resistance and solubility of the soluble polyfunctional vinyl aromatic copolymer into a solvent. The indan structure is formed by an attack of an active site on a terminal of a growing polymer chain on aromatic rings of the structural units derived from the divinyl aromatic compound and the monovinyl aromatic compound in production of the polyfunctional vinyl aromatic copolymer under specific production conditions including a solvent, a catalyst, and a temperature. An amount of the indan structure present is preferably 0.01 mol % or more, more preferably 0.1 mol % or more, furthermore preferably 1 mol % or more, particularly preferably 3 mol % or more, and most preferably 5 mol % or more with respect to a total amount of the structural units of the monomers. An upper limit of the amount of the indan structure is preferably 20 mol % or less, and more preferably 15% or less. Absence of the indan structure in the main chain skeleton of the polyfunctional vinyl aromatic copolymer undesirably provides insufficient heat resistance and solubility into a solvent.

A number average molecular weight Mn (in standard polystyrene equivalents obtained through gel permeation chromatography) of the soluble polyfunctional vinyl aromatic copolymer is preferably 600 to 30,000, more preferably 600 to 10,000, and most preferably 700 to 5,000. Mn of less than 600 undesirably provides too low a viscosity of the soluble polyfunctional vinyl aromatic copolymer and degrades workability such as difficulties in formation of a thick film. Mn of 30,000 or more may undesirably cause gelling or degradation of compatibility with another resin component and may cause degradation of appearance or degradation of physical properties in formation of a film or the like.

The soluble polyfunctional vinyl aromatic copolymer has a molecular weight distribution (Mw/Mn) of 20 or less, preferably 15 or less, more preferably 10 or less, and most preferably 5 or less. Mw/Mn of more than 20 may undesirably cause problems such as degradation of working properties with increase in viscosity of the curable resin composition of the present invention, and degradation of appearance or physical properties with degradation of compatibility with another resin component.

A content of metal ions in the soluble polyfunctional vinyl aromatic copolymer to be used as the component (B) is preferably 500 ppm or less, more preferably 100 ppm or less, furthermore preferably 20 ppm or less, and most preferably 1 ppm or less for each metal ion.

The soluble polyfunctional vinyl aromatic copolymer may be obtained through copolymerization by using a trivinyl aromatic compound, another divinyl compound, and another monovinyl compound in addition to the components (a) to (c) within a range not inhibiting the effect of the present invention.

Specific examples of the trivinyl aromatic compound include: 1,2,4-trivinylbenzene; 1,3,5-trivinylbenzene; 1,2,4-triisopropenylbenzene; 1,3,5-triisopropenylbenzene; 1,3,5-trivinylnaphthalene; and 3,5,4'-trivinylbiphenyl. Examples of the other divinyl compound include diene compounds such as butadiene and isoprene. Examples of the other monovinyl compounds include an alkylvinyl ether, an aromatic vinyl ether, isobutene, and diisobutylene. Those compounds may be used alone, or two or more kinds thereof may be used in combination. Those other monomers are used within a range of less than 30 mol % with respect to a total amount of monomers including the divinyl aromatic compound as the component (a) and the monovinyl aromatic compounds as the component (b) and the component (c).

The soluble polyfunctional vinyl aromatic copolymer may be produced through polymerization of monomer components including the divinyl aromatic compound (a), the ethylvinyl aromatic compound (b), and the monovinyl aromatic compound (c) except the ethylvinyl aromatic compound (b) in one or more kinds of solvents each having a dielectric constant of 2 to 15, in the presence of a Lewis acid catalyst and an initiator represented by the following general formula (13), and at a temperature of 20 to 100° C.

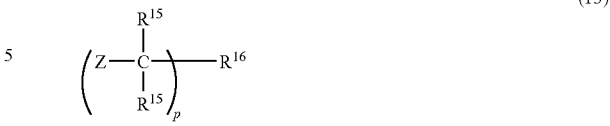

In the formula general (13): $R^{15}$ represents a hydrogen atom or a monovalent hydrocarbon group having 1 to 6 carbon atoms; $R^{16}$ represents an aromatic hydrocarbon group or aliphatic hydrocarbon group of p-valence; Z represents a halogen atom, or an alkoxy group or acyloxyl group having 1 to 6 carbon atoms; and p represents an integer of 1 to 6. In the case where a plurality of $R^{15}$s and Zs are present, $R^{15}$s and Zs may be identical to or different from each other.

After stop of a polymerization reaction, a method of recovering the copolymer is not particularly limited. Examples thereof include methods usually employed such as a steam stripping method and a method involving precipitation in a poor solvent.

A mixing ratio of the components (A) and (B) for producing the curable resin composition of the present invention may vary within a wide range, but mixing amounts of the component (A) and the component (B) must satisfy the following conditions.

Mixing amount of component (A)=20 to 98 (wt %)
Mixing amount of component (B)=2 to 80 (wt %)
Preferably, the mixing amount of the component (A) is 30 to 95 wt %, and the mixing amount of the component (B) is 5 to 70 wt %. A mixing amount of the component (B) of less than 2 wt % insufficiently improves chemical resistance, and a mixing amount thereof of more than 80 wt % degrades mechanical properties. Further, the polyphenylene ether oligomer having a vinyl group on each terminal and polyfunctional vinyl aromatic copolymer to be used in the present invention are each a material having low dielectric properties, and thus a cured product with a low dielectric constant may be formed.

The curable resin composition of the present invention may include one kind or two or more kinds of thermoplastic resins mixed as the component (C) in addition to the components (A) and (B). In the case where the component (C) is mixed, a mixing amount (weight ratio) of the component (C) is 2 to 60 wt %, and preferably 5 to 50 wt % with respect to a total amount of the component (A), the component (B), and the component (C). A mixing amount of the component (C) of less than 2 wt % degrades mechanical properties, and a mixing amount thereof of more than 60 wt % degrades chemical resistance.

Examples of the thermoplastic resin of the component (C) include: polyolefins such as polyethylene, polypropylene, and ethylene-propylene copolymers and its derivatives; polyamides such as nylon 4, nylon 6, and nylon-6,6 and its derivatives; polyesters such as polyethylene terephthalate and polybutylene terephthalate, and its derivatives; polystyrenes such as polyphenylene ether, modified polyphenylene ether, polycarbonate, polyacetal, polysulfone, polymethyl methacrylates, ester acrylate (or methacrylate) copolymers, polystyrenes, acrylonitrile styrene copolymers, and acrylonitrile styrene butadiene-based copolymers, and its copolymers; rubbers such as styrene conjugated diene block copolymers; rubbers such as hydrogenated styrene conjugated diene block copolymers; rubbers such as polybutadiene and polyisoprene; polyphosphasens; polyethersulfone, polyetherketone, polyetherimide, polyphenylene sulfide, polyamide imide, thermoplastic polyimide, or thermoplastic block copolymers having at least one functional group selected from an epoxy group, carboxylic acid group, and maleic anhydride group.

Of the thermoplastic resins, a block copolymer having a polymer segment with a glass transition temperature of 20° C. or lower is preferably used in combination for enhancing the effect of toughness. A block copolymer having a polymer segment with a glass transition temperature of 0° C. or lower is more preferably used. Preferred examples of the block copolymer having the polymer segment with a glass transition temperature of 20° C. or lower include: rubbers such as a styrene conjugated diene block copolymer; and rubbers such as a hydrogenated styrene conjugated diene block copolymer. Most preferred examples thereof include hydrogenated rubbers such as a hydrogenated styrene conjugated diene block copolymer from the viewpoint of oxidation degradation heat resistance of the curable resin composition of the present invention. A structure of the hydrogenated block copolymer is obtained through hydrogenation of a block copolymer formed of a polymer block A mainly containing at least one vinyl aromatic compound, and a polymer block B mainly containing at least one conjugated diene compound. The hydrogenated styrene conjugated diene block copolymer is obtained through hydrogenation of a vinyl aromatic compound/conjugated diene compound block copolymer having a structure such as: A-B; A-B-A; B-A-B-A; [A-B—]$_4$—Si; or [B-A-B—]$_4$—Si. This hydrogenated block copolymer contains the vinyl aromatic compound in an amount of 5 to 85 wt %, preferably 10 to 70 wt %, and more preferably 15 to 40 wt %.

Regarding a block structure, the polymer block A mainly containing a vinyl aromatic compound has a structure of a polymer block formed of the vinyl aromatic compound alone, or a structure of a copolymer block including the vinyl aromatic compound and the hydrogenated conjugated diene compound and containing the vinyl aromatic compound in an amount of more than 50 wt %, and preferably 70 wt % or more. The polymer block B mainly containing a hydrogenated conjugated diene compound has a structure of a polymer block formed of the hydrogenated conjugated diene compound alone, or a structure of a copolymer block including the hydrogenated conjugated diene compound and the vinyl aromatic compound and containing the hydrogenated conjugated diene compound in an amount of more than 50 wt %, and preferably 70 wt % or more.

In the polymer block A mainly containing a vinyl aromatic compound and the polymer block B mainly containing a hydrogenated conjugated diene, distribution of the hydrogenated conjugated diene compound or the vinyl aromatic compound in a molecular chain of each polymer block may be in a random, tapered (monomer components increase or decrease along a molecular chain), or partly block form, or in a form of any combination thereof. In the case where two or more the polymer blocks mainly containing a vinyl aromatic compound and the polymer blocks mainly containing a hydrogenated conjugated diene compound, respectively, are present, the polymer blocks may have an identical structure or different structures.

As the vinyl aromatic compound used for forming the hydrogenated block copolymer, one kind or two or more kinds of compounds may be selected from styrene, α-methylstyrene, p-methylstyrene, vinyltoluene, and p-tertiary butylstyrene, for example. Of those, styrene is preferred. As a conjugated diene compound before hydrogenation used for forming the hydrogenated conjugated diene compound, one kind or two or more kinds of compounds may be selected from butadiene, isoprene, 1,3-pentadiene, and 1,3-dimethyl-1,3-butadiene, for example. Of those, butadiene, isoprene, and a combination thereof are preferred. Butadiene is most preferred from the viewpoint of compatibility with the component (A) and the component (B) of the present invention.

A number average molecular weight Mn of the hydrogenated block copolymer having the above-mentioned structure and to be used in the present invention is not particularly limited, but falls within a range of 5,000 to 1,000,000, preferably 10,000 to 500,000, and more preferably 30,000 to 300,000. A molecular structure of the hydrogenated block copolymer may be any of a linear, branched, or radial structure, or a structure of any combination thereof.

The curable resin composition of the present invention may be mixed a heat-curable resin mixed as the component (D). In the case where the component (D) is mixed, a mixing amount of the component (D). is 2 to 40 wt %, and preferably 5 to 85 wt % with respect to a total amount of the component (A), the component (B), the component (C), and the component (D). A mixing amount of the component (D) of less than 2 wt % insufficiently improves adhesiveness and chemical resistance as an effect of adding a filler, and a mixing amount thereof of more than 40 wt % significantly degrades mechanical properties of the composition.

The curable resin composition may include another crosslinking component except the component (B) within a range not inhibiting the effect of the present invention. Examples of the crosslinking component include: compounds such as a polyfunctional epoxy compound, diallylphthalate, a polyfunctional acryloyl compound, a polyfunctional methacryloyl compound, a polyfunctional maleimide, a polyfunctional cyanate, a polyfunctional isocyanate, and an unsaturated polyester; and prepolymers thereof. One kind or two or more kinds of crosslinking components may be used.

The polyfunctional epoxy compound may be an epoxy resin having two or more epoxy groups in a molecule. Examples thereof include a bisphenol-A epoxy resin, a bisphenol-F epoxy resin, a bisphenol-S epoxy resin, a hydantoin epoxy resin, an alicyclic epoxy resin, a biphenyl epoxy resin, an epoxy resin obtained through halogenation of those resins, a triphenylmethane epoxy resin, tetraphenyl glycidyl ether ethane (a tetrafunctional epoxy resin), and various novolac epoxy resins. Two or more kinds of epoxy resins may be used in combination. Note that an epoxy resin having one epoxy group in a molecule may be used in combination within a range not inhibiting the effect of the represent invention.

In the case where the polyfunctional epoxy compound is used, examples of a curing agent for the polyfunctional epoxy compound to be included in the curable resin composition of the present invention include: an amide-based curing agent such as dicyanamide or an aliphatic polyamide; an amine-based curing agent such as diaminodiphenylmethane, metaphenylenediamine, ammonia, triethylamine, or diethylamine; a phenol-based curing agent such as bisphenol-A, bisphenol-F, a phenol novolac resin, a cresol novolac resin, or a p-xylene/novolac resin; and an acid anhydride. The curing agents may be used in combination within a range not inhibiting the effect of the present invention.

In the case where the polyfunctional epoxy compound is used, a curing accelerating agent for accelerating a curing reaction may be added within a range not inhibiting the effect of the present invention. Examples of the curing accelerating agent that may be added include: imidazoles such as 2-methylimidazole, 2-ethyl-4-methylimidazole, and 2-phenylimidazole; tertiary amines such as 1,8-diazabicyclo[5.4.0]undecene-7, triethylenediamine, and benzyldimethylamine;

organic phosphines such as tributylphosphine and triphenylphosphine; and tetraphenylborates such as tetraphenylphosphonium tetraphenylborate and triphenylphosphine tetraphenylborate. Two or more kinds of curing accelerating agents may be used in combination.

Meanwhile, any of ortho-, meta-, and para-isomers of diallylphthalate may be used as the component (E).

The polyfunctional (meth)acryloyl compound may include a compound represented by the following formula:

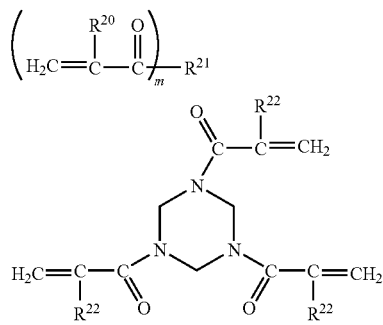

wherein: m represents an integer of 2 to 10; $R^{20}$ and $R^{22}$ each represent hydrogen or a methyl group; and $R^{21}$ represents a residue of a polyhydric hydroxyl compound.

In the formula, examples of the residue $R^{21}$ of the polyhydric hydroxyl compound include: a residue of a polyether polyol such as ethylene glycol, propylene glycol, or butanediol; a residue of an aromatic polyol in which a plurality of benzene rings are connected through a bridge part such as xylene glycol or bisphenol A, and an aromatic polyol residue such as an alkylene oxide adduct of an aromatic polyol; and a residue of a benzene multinuclear substance (usually, an decanuclear or less substance is preferably used) obtained through a reaction of phenol and formaldehyde.

Specific examples of the polyfunctional (meth)acryloyl compound include ethylene glycol diacrylate, propylene glycol diacrylate, 1,4-butanediol diacrylate, polyethylene glycol diacrylate, polypropylene glycol diacrylate, and bisphenol A-diacrylate; polyacrylate of a phenol resin initial condensate; and epoxy acrylates obtained by a reaction between a bisphenol A-based epoxy resin, a novolac-based epoxy resin, a cycloaliphatic epoxy resin, phthalic diglycidyl ester, polycarboxylic acid, and the like and an acrylic acid.

Further, examples of the polyfunctional (meth)acryloyl compound include hexahydro-1,3,5-triacryloyl-s-triazine and hexahydro-1,3,5-trimethacryloyl-s-triazine.

The polyfunctional maleimide may include a compound represented by the following formula:

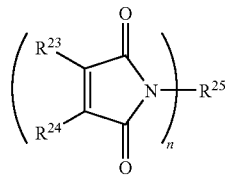

wherein: n represents an integer of 2 to 10; $R^{23}$ and $R^{24}$ each represent hydrogen, a halogen, or a lower alkyl group; and $R^{25}$ represents a divalent to decavalent aromatic or aliphatic organic group.

The polyfunctional maleimide is produced through a reaction of maleic anhydrides and polyamine having 2 to 10 amino groups in a molecule to form maleimide acid, and dehydration ring formation of the maleimide acid.

Examples of the preferable polyamine include metaphenylene diamine, paraphenylene diamine, metaxylylene diamine, paraxylylene diamine, 4,4-diaminobiphenyl, bis(4-aminophenyl)methane, bis(4-aminophenyl)ether, bis(4-aminophenyl)sulfone, 2,2-bis(4-aminophenyl)propane, melanins having s-triazine rings, and polyamine obtained by a reaction between aniline and formaldehyde (usually, an decanuclear or less substance is preferably used).

The polyfunctional cyanate may include a compound represented by the following formula:

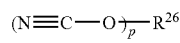

wherein: p represents an integer of 2 to 10; $R^{26}$ represents a divalent to decavalent aromatic organic group; and a cyanate group is directly bonded to an aromatic ring of the organic group $R^{26}$.

Examples of those polyfunctional cyanate include 1,3-dicyanatebenzene, 1,4-dicyanatebenzene, 2,6-dicyanatenaphthalene, 4,4-dicyanatebiphenyl, bis(4-cyanatephenyl)methane, 2,2-bis(4-cyanatephenyl)propane, bis(4-cyanatephenyl) ether, bis(4-cyanatephenyl)thioether, bis(4-cyanatephenyl) sulfone, and a polycyanate compound of benzene polynucleus obtained by a reaction between a phenol resin and a cyan halide.

The polyfunctional isocyanate may include a compound represented by the following formula:

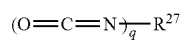

wherein: q represents an integer of 2 to 10; $R^{27}$ represents a divalent to decavalent aromatic or aliphatic organic group.

Examples of such polyfunctional isocyanate include 2,4-toluene diisocyanate, 2,6-toluene diisocyanate, metaphenylene diisocyanate, and paraphenylene diisocyanate.

Those polyfunctional isocyanates can also be used by converting into polyfunctional block isocyanate by using various block agents. Examples of the block agent which can be used herein include alcohols, phenols, oximes, lactam, malonate, acetoacetate, acetylacetone, amides, imidazoles, and sulfites, each of which is well known.

Examples of the unsaturated polyester which can be used herein include those obtained by a reaction of glycols with unsaturated polybasic acid or saturated polybasic acid, or anhydride, ester, or acid chloride of these acids, each of which is generally known.

Examples of the representative glycols include ethylene glycol, propylene glycol, diethylene glycol, difropylene glycol, neopentyl glycol, 1,3-butanediol, 1,4-butanediol, 1,6-hexanediol, bisphenol A hydride, bisphenol A propylene oxide adduct, and dibromoneopentol glycol.

Examples of the representative unsaturated polybasic acid include maleic anhydride, fumaric acid, and itaconic acid. Examples of the representative saturated polybasic acid include phthalic anhydride, isophthalic acid, terephthalic acid, tetrahydrophthalic anhydride, methyltetrahydrophthalic anhydride, endomethylenetetrahydrophthalic anhydride, adipic acid, sebacic acid, tetto acid, and tetrabromophthalic anhydride.

Details of the unsaturated polyester may be referred to "Polyester Resin Handbook", written by Eichiro Takiyama, published by The Nikkankogyo Shimbun, Ltd. (1988), for example.

In the case where the component (D) is mixed into the curable resin composition of the present invention, one kind of compound described above may be used or two or more kinds thereof may be used in combination as the component (D). A prepolymer obtained through a preliminary reaction of those compounds with heat, light, or the like in the presence or absence of a known catalyst, initiator, curing agent, and the like described below may be used as the component (D) of the present invention.

Of the component (D) to be used in the curable resin composition of the present invention, the polyfunctional epoxy compound is most preferred from the viewpoint of effect of improving adhesiveness between the curable resin composition of the present invention and a foreign material such as a metal.

The curable resin composition of the present invention may include a filler mixed as the component (E). In the case where the component (E) is mixed, a mixing amount of the component (E) is 2 to 90 wt %, and preferably 5 to 85 wt % with respect to a total amount of the component (A), the component (B), the component (C), the component (D), and the component (E). A mixing amount of the component (E) of less than 2 wt % insufficiently improves mechanical properties as an effect of adding the filler, and a mixing amount thereof of more than 90 wt % significantly degrades fluidity of the composition.

Examples of the filler as the component (E) include carbon black, silica, alumina, talc, mica, glass beads, glass hollow spheres. The filler may be in a form of fiber or powder.

The resin composition of the present invention cures through a crosslinking reaction by means of heating or the like as described below, and a radical initiator may be included and used for lowering a reaction temperature in curing or accelerating a crosslinking reaction of an unsaturated group. An amount of the radical initiator to be used for this purpose is 0.1 to 10 wt %, and preferably 0.1 to 8 wt % with respect to a total amount of the component (A) and the component (B).

Examples of the representative radical initiator include, but not limited to, peroxides such as benzoyl peroxide, cumene hydroperoxide, 2,5-dimethylhexane-2,5-dihydroperoxide, 2,5-dimethyl-2,5-di(t-butylperoxy)hexine-3, di-t-butyl peroxide, t-butyl cumyl peroxide, α,α'-bis(t-butylperoxy-m-isopropyl)benzene, 2,5-dimethyl-2,5-di(t-butylperoxy)hexane, dicumyl peroxide, di-t-butyl peroxy isophthalate, t-butyl peroxy benzoate, 2,2-bis(t-butylperoxy)butane, 2,2-bis(t-butylperoxy)octane, 2,5-dimethyl-2,5-di(benzoylperoxy)hexane, di(trimethylsilyl)peroxide, and trimethylsilyl triphenylsilyl peroxide. Also, an example of the radical initiator includes, but not peroxide, 2,3-dimethyl-2,3-diphenylbutane. However, the radical initiator which can be used to cure the resin composition of the present invention is not limited to these examples.

An example of the curing agent appropriate for the polyfunctional maleimide to be used as the component (D) for the curable resin composition of the present invention is a polyamine. Examples of a catalyst appropriate for the polyfunctional cyanate include: a mineral acid; a Lewis acid; salts such as sodium carbonate and lithium chloride; and a phosphoric acid ester such as tributylphosphine. Examples of the catalyst and curing agent appropriate for the polyfunctional isocyanate include amines, an organic metal, polyhydric alcohol, and the like described in p. 118 to 123 of "Polyurethane Resin Handbook", edited by Keiji Iwata, published by The Nikkankogyo Shimbun, Ltd. (1987).

The catalyst, initiator, curing agent, and the like may appropriately be selected and used in accordance with the kind of crosslinking component.

Next, description will be given of a curable resin composition containing a layered silicate as the component (J). The layered silicate is one kind of filler as the component (E), but in the curable resin composition containing a layered silicate, the component (J) is calculated separately from the component (E).

The curable resin composition containing a layered silicate of the present invention has excellent curing properties, dielectric properties, heat resistance, and heat hydrolysis resistance after thin film formation, and may be used for a dielectric material, insulating material, heat resistant material, packaging material, adhesive material, or the like of a thin formed product in advanced technology fields of electronics industry, aerospace industry, and the like.

The curable resin composition containing a layered silicate of the present invention is a curable resin composition containing the polyphenylene ether oligomer as the component (A), the solvent-soluble polyfunctional vinyl aromatic copolymer as the component (B), and the layered silicate as the component (J), characterized in that a mixing amount of the component (J) is 0.1 to 98 wt %. This curable resin composition may contain the components (C) to (E) and other components in addition to the component (A) and the component (B), and mixing ratios of the components (C) to (E) and other components if contained are preferably the same as those described above.

Here, the curable resin composition containing a layered silicate may satisfy one or more of the following requirements 1) to 8), to thereby provide a more favorable curable resin composition.

1) The component (B) has an indan structure represented by the general formula (4) in a main chain structure of the polyfunctional vinyl aromatic copolymer having structural units derived from monomers of the divinyl aromatic compound (a) and the ethylvinyl aromatic compound (b).
2) The component (B) has a structural unit derived from the monovinyl aromatic compound (c) except the ethylvinyl aromatic compound (b) in the polyfunctional vinyl aromatic copolymer having structural units derived from monomers of the divinyl aromatic compound (a) and the ethylvinyl aromatic compound (b).
3) The component (J) is a swelling layered silicate having affinity to an organic solvent.
4) One or more components selected from a thermoplastic resin as the component (C), a heat-curable resin as the component (D), and a filler as the component (E) are included in addition to the component (B) and the component (J). The mixing amount of the component (C) is 1 to 80 wt %, the mixing amount of the component (D) is 1 to 80 wt %, and the mixing amount of the component (E) is 2 to 90 wt % with respect to a total amount of the components (B) to (E) and the component (J).
5) The mixing amount of the component (C) is 1 to 80 wt % with respect to a total amount of the component (J), the component (B), and the component (C).
6) The component (C) is one or more thermoplastic resins selected from the group consisting of the block copolymer having a polymer segment with a glass transition temperature of 20° C. or lower, and polyphenylene ether.

The same compounds as those described above may be used for the components (A) to (D) except the layered silicate as the component (J). Thus, description will be given of the layered silicate as the component (J).

The layered silicate to be used in the curable resin composition containing a layered silicate refers to a layered silicate mineral having exchangeable metal cations between layers, and may be a natural substance or a synthetic substance. The layered silicate is not particularly limited, and examples thereof include: a smectite-based clay mineral such as montmorillonite, hectorite, saponite, beidellite, stevensite, or nontronite; swelling mica; vermiculite; and halloysite. Of those, at least one kind of layered silicate selected from the group consisting of montmorillonite, hectorite, and swelling mica is preferably used. The layered silicate may be used alone, or two or more kinds thereof may be used in combination.

A crystalline shape of the layered silicate is not particularly limited. However, a preferred lower limit of an average length is 0.005 μm, and a preferred upper limit thereof is 3 μm. A preferred lower limit of a thickness is 0.001 μm, and a preferred upper limit thereof is 1 μm. A preferred lower limit of an aspect ratio is 20, and a preferred upper limit thereof is 500. A more preferred lower limit of the average length is 0.01 μm, and a more preferred upper limit thereof is 2 μm. A more preferred lower limit of the thickness is 0.005 μm, and a more preferred upper limit thereof is 0.5 μm. A more preferred lower limit of the aspect ratio is 50, and a more preferred upper limit thereof is 200.

The layered silicate preferably has a large shape anisotropy effect defined by the following expression (3). A layered silicate having a large shape anisotropy effect (E) is used, to thereby provide a cured resin obtained from the resin composition with excellent dynamic properties. Note that S1 represents a surface area of a laminate surface of flaky crystals, and S2 represents a surface area of a laminate side surface of the flaky crystals.

$$(E)=S1/S2 \qquad (3)$$

The exchangeable metal cations present between the layers of the layered silicate refer to metal ions of sodium, calcium, or the like present on the surface of the flaky crystals of the layered silicate. The metal cations have cation exchange property with cationic substances, and thus various cationic substances may be inserted (intercalated) between the layers of crystals of the layered silicate.

A cation exchange capacity of the layered silicate is not particularly limited. However, a preferred lower limit thereof is 50 meq/100 g, and a preferred upper limit thereof is 200 meq/100 g. A cation exchange capacity of less than 50 meq/100 g reduces amounts of the cationic substances to be intercalated between the layers of crystals of the layered silicate through cation exchange, and a part between the layers of crystals may not be sufficiently unpolarized (hydrophobically treated). A cation exchange capacity of more than 200 meq/100 g excessively increases a bonding force between the layers of crystals of the layered silicate, and crystal flakes may hardly be peeled off.

The layered silicate preferably has improved dispersibility in a resin through chemical treatment. Hereinafter, such a layered silicate is also referred to as an organized layered silicate. The chemical treatment may be performed through the following chemical modification methods (1) to (6), for example. The chemical modification method may be used alone, or two or more kinds thereof may be used in combination.

A chemical modification method (1) is also referred to as a cation exchange method by using a cationic surfactant. To be specific, the method involves cation exchanging of a part between layers of the layered silicate with a cationic surfactant for hydrophobic treatment. Through hydrophobic treatment of the part between the layers of the layered silicate in advance, affinity between the layered silicate and a low polarity resin increases, to thereby allow uniform and fine dispersion of the layered silicate in the low polarity resin.

The cationic surfactant is not particularly limited, and examples thereof include a quaternary ammonium salt and a quaternary phosphonium salt. Of those, a quaternary ammonium salt containing alkyl ammonium ions having 6 or more carbon atoms and having an alkyl chain having 6 or more carbon atoms is preferably used because the salt allows sufficient hydrophobic treatment between the layers of crystals of the layered silicate.

The quaternary ammonium salt include, but not particularly limited to, trimethylalkyl ammonium salt, a triethylalkyl ammonium salt, a tributylalkyl ammonium salt, a trihexylalkyl ammonium salt; a trioctylalkyl ammonium salt, a dimethyldialkyl ammonium salt, a dibutyldialkyl ammonium salt, a methylbenzyldialkyl ammonium salt, a dibenzyldialkyl ammonium salt, a trialkylmethyl ammonium salt, a trialkylethyl ammonium salt, a trialkylbutyl ammonium salt, a quaternary ammonium salt having aromatic ring(s), a quaternary ammonium salt derived from aromatic amine such as trimethylphenyl ammonium salt, a dialkyl quaternary ammonium salt having two polyethylene glycol chains, a dialkyl quaternary ammonium salt having two polypropylene glycol chains, a trialkyl quaternary ammonium salt having one polyethylene glycol chain, and a trialkyl quaternary ammonium salt having one polypropylene glycol chain. Of those, a lauryltrimethyl ammonium salt, a stearyltrimethyl ammonium salt, a trioctylmethyl ammonium salt, a distearyldimethyl ammonium salt, a dihydrogenated tallow dimethyl ammonium salt, a distearyldibenzyl ammonium salt, an N-polyoxyethylene-N-lauryl-N,N-dimethyl ammonium salt, and the like are preferably used. The quaternary ammonium salt may be used alone, or two or more kinds thereof may be used in combination.

The quaternary phosphonium salt is not particularly limited, and examples thereof include, a dodecyltriphenyl phosphonium salt, a methyltriphenyl phosphonium salt, a lauryltrimethyl phosphonium salt, a stearyltrimethyl phosphonium salt, a trioctyl phosphonium salt, a distearyidimethyl phosphonium salt, and a distearyldibenzyl phosphonium salt. The quaternary phosphonium salt may be used alone, or two or more kinds of them may be used in combination.

A chemical modification method (2) refers to a method involving chemical treatment of a hydroxyl group present on the surface of the crystals of the organized layered silicate subjected to the chemical treatment through the chemical modification method (1) with a compound having on molecular terminals one or more functional groups capable of chemically bonding with the hydroxyl group or one or more functional groups having high chemical affinity to the hydroxyl group.

The functional group capable of chemically bonding with the hydroxyl group or the functional group having high chemical affinity to the hydroxyl group is not particularly limited, and examples thereof include an alkoxy group, a glycidyl group, a carboxyl group (including a dibasic anhydride), a hydroxyl group, an isocyanate group, and an aldehyde group. The compound containing functional groups capable of chemically bonding with the hydroxyl group or the compound containing functional groups having high chemical affinity to the hydroxyl group is not particularly limited, and examples thereof include a silane compound, a titanate compound, a glycidyl compound, carboxylic acids, and alcohols each containing the functional groups. One kind of compound may be used alone, or two or more kinds thereof may be used in combination.

The silane compound is not particularly limited, and examples thereof include vinyltrimethoxysilane, vinyltriethoxysilane, vinyltris(β-methoxyethoxy)silane, tilltriethoxysilane, dimethyldimethoxysilane, trimethylmethoxysilane, hexyltrimethoxysilane, glycidoxypropyltrimethoxysilane, octadecyltrimethoxysilane, octadecyltriethoxysilane, and γ-methacryloxypropylmethyldimethoxysilane. The silane compound may be used alone, or two or more kinds thereof may be used in combination.

A chemical modification method (3) refers to a method involving chemical treatment of a hydroxyl group present on the surface of the crystals of the organized layered silicate subjected to the chemical treatment through the chemical modification method (1) with a compound having on molecular terminals one or more functional groups capable of chemically bonding with the hydroxyl group or one or more functional groups having high chemical affinity to the hydroxyl group, and one or more reactive functional groups.

A chemical modification method (4) refers to a method involving chemical treatment of the surface of the crystals of the organized layered silicate subjected to the chemical treatment through the chemical modification method (1) with a compound containing an anionic surfactant.

The compound containing an anionic surfactant is not particularly limited as long as it is capable of chemically treating the layered silicate through an ion interaction. Examples thereof include sodium laurate, sodium stearate, sodium oleate, a higher alcohol sulfate, a secondary higher alcohol sulfates, and an unsaturated alcohol sulfate. The compound containing an anionic surfactant may be used alone, or two or more kinds thereof may be used in combination.

A chemical modification method (5) refers to a method involving chemical treatment with a compound having one or more reactive functional groups on a position except an anionic position in a molecular chain selected from the compounds each containing an anionic surfactant.

A chemical modification method (6) refers to a method involving additional chemical treatment of the organized layered silicate subjected to the chemical treatment through any one of the chemical modification methods (1) to (5) with a resin having a functional group capable of reacting with the layered silicate such as a maleic anhydride-modified polyphenylene ether resin, for example.

A mixing ratio between the components (J) and (B) may vary within a wide range for producing the curable resin composition containing a layered silicate. However, the component (J) is mixed in a ratio of 2 to 99.9 (wt %), preferably 3 to 99.5 wt %, and more preferably 30 to 99.0 wt %. The component (B) is mixed in a ratio of 0.1 to 98 (wt %), preferably 0.5 to 97 wt %, and more preferably 1.0 to 70 (wt %). A mixing amount of the component (B) of less than 0.1 wt % degrades a curing acceleration action which is the effect of the layered silicate, and a mixing amount thereof of more than 98 wt % degrades mechanical properties. The polyfunctional vinyl aromatic copolymer as the component (B) has low dielectric properties, and thus a cured product with a low dielectric constant may be formed.

Next, description will be given of a curable resin composition containing a layered silicate as the component (J) and a halogen-based flame retardant as the component (K).

This curable resin composition contains an antimony compound such as antimony trioxide, which is concerned for its toxicity, in an amount less than an effective amount and has excellent flame retardance, high heat resistance, heat impact resistance, low dielectric properties, and excellent reliability. A specific halogen-based flame retardant and a specific layered silicate are mixed in an aromatic resin, to thereby provide a thin formed product or cured product which has a high level of flame retardance, favorable appearance, forming workability, curing properties, dielectric properties, heat resistance, and heat hydrolysis resistance, and which can be used for a dielectric material, insulating material, heat resistant material, packaging material, adhesive material, casing material, or the like of a thin formed product in advanced technology fields of electronics industry, aerospace industry, and the like.

In addition to the component (A) and the component (B) which are essential ingredients for constituting the curable resin composition of the present invention, and the component (C), the component (D), and the component (E) which are added as desired, this flame retardant curable resin composition is characterized by including:

Component (J): layered silicate, preferably at least one kind of layered silicate selected from the group consisting of montmorillonite, wetting mica, and hectrite, Component (K): halogen-based flame retardant, preferably at least one kind of halogen-based flame retardant selected from the group consisting of decabromodiphenyl oxide, octabromodiphenyl oxide, tetrabromodiphenyl oxide, ethane-1,2-bis(pentabromophenyl), bis(2,4,6-tribromophenoxy)ethane, ethylenebistetrabromo phthalimide, polydibromophenylene oxide, tetrabrombisphenol-S, 1,1-sulfonyl[3,5-dibromo-4-(2,3-dibromopropoxy)]benzene, tris(2,3-dibromopropyl-1)isocyanurate, tris(tribromophenyl)cyanurate, a brominated polystyrene having an atactic structure, a brominated styrene-methylmethacrylate-based copolymer having an atactic structure, a brominated styrene-methylmethacrylate-glycidylmethacrylate-based copolymer having an atactic structure, a brominated styrene-glycidylmethacrylate-based copolymer having an atactic structure, a brominated styrene-polypropylene-based copolymer having an atactic structure, brominated polyethylene, a tetrabrombisphenol-A, tetrabrombisphenol-A-epoxy oligomer, a brominated epoxy compound (for example, a diepoxy compound produced by a reaction between brominated bisphenol-A and epichlorohydrin, and an epoxy compound obtained by a reaction between brominated phenols and epichlorohydrin), a tetrabrombisphenol-A-carbonate oligomer, tetrabrombisphenol-A-bis(2-hydroxydiethylether), tetrabrombisphenol-A-bis(2,3-dibromopropylether), poly(pentabromobenzylacrylate), and octabromotrimethylphenyl indan, in which the mixing amount of the component (J) is 0.1 to 95.9 wt %, and the mixing amount of the component (K) is 0.1 to 95.9 wt %. In addition to the component (A) and the component (B), the components (C) to (E) and the other component can be mixed to this flame retardant curable resin composition. Preferably, the mixing ratio of the components (C) to (E) and the other component in a case where the flame retardant curable resin composition include these components is the above-mentioned ratio.

The flame retardant curable resin composition containing the component (J) and the component (K) satisfies one or more of the following requirements in addition to requirements for the heat-curable composition formed of the components (A) to (J) to develop more favorable properties, to thereby provide a more favorable flame retardant curable resin composition.

1) The thermoplastic resin as the component (C) is one or more thermoplastic resins each having an aromatic structure.
2) The heat-curable resin as the component (D) is one or more heat-curable resins each having an aromatic structure.

The halogen-based flame retardant as the component (K) to be used in the flame retardant curable resin composition is the same as that described above, but the halogen-based flame retardant may be used alone or by two or more kinds thereof in combination.

More preferably, from the aspect of the synergetic effect and the heat resistance in the flame retardant of the component (A), the component (B), and the component (J), the halogen-based flame retardant of the component (K) is one or more kinds of halogen-based flame retardant selected from the group consisting of decabromodiphenyl oxide, ethane-1,2-bis(pentabromophenyl), bis(2,4,6-tribromophenoxy) ethane, ethylenebistetrabromo phthalimide, polydibromophenylene oxide, tris(tribromophenyl)cyanurate, a brominated polystyrene having an atactic structure, a brominated styrene-methylmethacrylate-based copolymer having an atactic structure, a brominated styrene-methylmethacrylate-glycidylmethacrylate-based copolymer having an atactic structure, a brominated styrene-glycidylmethacrylate-based copolymer having an atactic structure, a brominated styrene-polypropylene-based copolymer having an atactic structure, a tetrabrombisphenol-A-epoxy oligomer, a brominated epoxy compound (for example, a diepoxy compound produced by a reaction between brominated bisphenol-A and epichlorohydrin, and an epoxy compound obtained by a reaction between brominated phenols and epichlorohydrin), a tetrabrombisphenol-A-carbonate oligomer, tetrabrombisphenol-A-bis (2-hydroxydiethylether), poly(pentabromobenzylacrylate), and octabromotrimethylphenyl indan.

Still more preferably, the halogen-based flame retardant is one or more kinds of halogen-based flame retardant selected from the group consisting of (ethane-1,2-bis(pentabromophenyl), polydibromophenylene oxide, tris(tribromophenyl)cyanurate, a brominated polystyrene having an atactic structure, a tetrabrombisphenol-A-epoxy oligomer, a brominated epoxy compound (for example, a diepoxy compound produced by a reaction between brominated bisphenol-A and epichlorohydrin, and an epoxy compound obtained by a reaction between brominated phenols and epichlorohydrin).

Meanwhile, from the aspect of the poor dielectric property of the flame retardant curable resin composition, the halogen-based flame retardant of the component (K) is preferably one or more kinds of halogen-based flame retardant selected from the group consisting of ethane-1,2-bis(pentabromophenyl), polydibromophenylene oxide, and brominated styrene having an atactic structure.

The layered silicate as the component (J) to be used in the flame retardant curable resin composition may be the component (J) described in the invention regarding the curable resin composition containing a layered silicate. At least one kind selected from the group consisting of montmorillonite, hectorite, and swelling mica is preferably used.

A mixing ratio of the components (A) to (E), the component (J), and the component (K) for producing the flame retardant curable resin composition may vary within a wide range, but mixing amounts of the respective components with respect to a total amount of the components (A) to (E), the component (J), and the component (K) must satisfy the following conditions.

Total mixing amount of component (A) to component (E)=4 to 99.8 wt %, preferably 6 to 99 wt %, and more preferably 30 to 96 wt %

Mixing amount of component (J)=0.1 to 95.9 wt %, preferably 0.5 to 90 wt %, and more preferably 2 to 70 wt %

Mixing amount of component (K)=0.1 to 95.9 wt %, preferably 0.5 to 80 wt %, and more preferably 1 to 50 wt %

The flame retardant curable resin composition may include another component as described above in addition to the components (A) to (E), the component (J), and the component (K), but a mixing amount of the other component is preferably within the range described above.

For further improving flame retardance, one or more flame retardants selected from the group consisting of a nitrogen-based flame retardant, a phosphorus-based flame retardant, a nitrogen/phosphorus-based flame retardant, and an inorganic flame retardant may be used as a component (G) in an amount within a range not inhibiting the effect of the present invention.

The nitrogen-based flame retardant to be used as the component (G) refers to a flame retardant exhibiting a flame retardant effect by retrieving heat from a mixed resin through endothermic decomposition of the resin exposed to high temperatures and forming an inert atmosphere. In particular, heat absorption of the nitrogen-based flame retardant is preferably 50 mJ or more, and particularly preferably 150 mJ or more per 1 mg of the flame retardant during decomposition through differential thermal analysis. A known nitrogen-based flame retardant may be used without particular limitation, but examples thereof include an aliphatic amine compound, an aromatic amine compound, triazine, melamine, benzoguanamine, methylguanamine, a nitrogen containing heterocyclic compound such as cyanuric acid, a cyan compound, an aliphatic amide, an aromatic amide, urea, and thiourea.

A salt of each of the compounds described above may be used as the nitrogen-based flame retardant as the component (G). Examples of the salt include a sulfate, a nitrate, a borate, and a cyanurate.

Of the nitrogen-based flame retardants, an aliphatic amine compound, a triazine compound, and salts thereof each exhibit an excellent flame retardant effect, and thus those compounds may preferably be used in the present invention.

The phosphorus-based flame retardant to be used as the component (G) is known to form a polyphosphoric acid compound from a mixed resin exposed to high temperatures to form a heat resistant film and to exhibit a flame retardant effect through a carbonization acceleration mechanism of a solid acid. A known phosphorus-based flame retardant may be used without particular limitation. However, specific examples thereof include: a single substance of phosphorus such as red phosphorus; a phosphoric salt such as calcium phosphate or titanium phosphate; a phosphoric acid ester such as tributyl phosphate or triphenyl phosphate; a polyphosphoric acid; a polyphosphoric salt such as calcium polyphosphate; and a polyphosphoric acid ester such as poly (diphenylphosphate).

Of those, a phosphoric acid ester, a phosphoric salt, and a polyphosphoric salt are preferably used because of a large flame retardant effect and favorable electrical properties.

In the present invention, the nitrogen/phosphorus-based flame retardant having a nitrogen atom and a phosphorus atom in a molecule may be used as a compound having functions of the nitrogen-based flame retardant and the phosphorus-based flame retardant each described as the component (G). Such a flame retardant is used, to thereby obtain a resin composition having particularly excellent flame retardance. Examples of the flame retardant include: a phosphoric salt and a polyphosphoric salt of each compound exemplified as the nitrogen-based flame retardants; a phosphazene compound such as phenoxy phosphazene or methylphenoxy phosphazene; a phosphamide such as N,N-diethyl phosphamide; a polyphosphamide such as poly(N,N-diethylphosphamide). A polyphosphoric salt and a phosphazene compound each have a large flame retardant effect and thus may preferably be used in the present invention. A phosphazene compound is most preferably used from the viewpoint of electrical properties.

The nitrogen/phosphorus-based flame retardant may be used alone, or two or more kinds thereof may be mixed and used.

Examples of the inorganic flame retardant that may preferably be used as the component (G) include one or more inorganic flame retardants selected from the group consisting of a metal hydroxide and a metal oxide.

Examples of the metal hydroxide that may preferably be used as the inorganic flame retardant include a magnesium hydroxide, an aluminum hydroxide, and hydrotalcites.

The metal hydroxide that may preferably be used as the component (G) is desirably subjected to surface treatment. The surface treatment preferably provides an effect of improving heat resistance of the metal hydroxide and improving appearance and flame retardance of a formed product.

Meanwhile, examples of the metal oxide that may preferably be used as the inorganic flame retardant as the component (G) include metal oxides such as a copper oxide, magnesium oxide, tungsten oxide, titanium oxide, zinc oxide, iron oxide, barium oxide, and manganese oxide. An antimony oxide compound is not used as the component (G) of the present invention from the viewpoint of toxicity, but may be included in a trace amount.

A mixing amount of the nitrogen-based flame retardant, the phosphorus-based flame retardant, the nitrogen/phosphorus-based flame retardant, or the inorganic flame retardant as the component (G) is preferably 0.1 to 25 wt %, preferably 0.1 to 20 wt %, and particularly preferably 0.2 to 15 wt % with respect to a total amount of the components (A) to (E), the component (J), and the component (K). A mixing amount thereof of less than 0.1 wt % undesirably provides an insufficient flame retardant effect, and a mixing amount thereof of more than 25 wt % undesirably degrades formability and mechanical properties.

Note that the flame retardant resin composition of the present invention preferably includes a flame retardant aid as a component (H). The flame retardant aid is mixed, to thereby allow improvement in oxygen index or significant reduction in maximum heat release rate. At least one flame retardant aid selected from the group consisting of a hindered amine-based compound, a fluorine resin, silicone oil, and a silicone/acryl composite rubber is preferably used, for example. Such a flame retardant aid is used, to thereby allow prevention in decomposition of the resins as the components (A) to (D) and suppression in maximum heat release rate.

A mixing amount of the flame retardant aid as the component (H) is 0.1 to 25 wt %, preferably 0.1 to 20 wt %, and particularly preferably 0.2 to 15 wt % with respect to a total amount of the components (A) to (E). A mixing amount of the flame retardant aid of less than 0.1 wt % undesirably provides an insufficient flame retardant effect, and a mixing amount thereof of more than 25 wt % undesirably degrades formability, flexibility, and stretch at break.

The curable resin composition of the present invention may further include an additive mixed in an amount within a range not inhibiting the intrinsic properties of the present invention for providing desired properties in accordance with the application of the curable resin composition. Examples of the additive include an antioxidant, a heat stabilizer, an antistatic agent, a plasticizer, a pigment, a dye, and a colorant.

The composition (wt %) of the curable resin composition of the present invention preferably falls within the following ranges.

1) In a case where the component (A) and the component (B) are essential components,
Component (A): 1 to 40%, preferably 10 to 30%
Component (B): 1 to 50%, preferably 20 to 45%
Component (C): 0 to 60%, preferably 20 to 50%
Component (D): 0 to 50%, preferably 2 to 20%
Component (E): 0 to 98%, preferably 0 to 10%

2) In a case where the component (A), the component (B), and the component (J) are essential components,
Component (A): 1 to 40%, preferably 10 to 30%
Component (B): 1 to 50%, preferably 20 to 45%
Component (C): 0 to 60%, preferably 20 to 50%
Component (D): 0 to 50%, preferably 2 to 20%
Component (E): 0 to 98%, preferably 0 to 10%
Component (J): 2 to 98%, preferably 2 to 10%

3) In a case where the component (A), the component (B), the component (J), and the component (K) are essential components,
Component (A): 1 to 40%, preferably 10 to 30%
Component (B): 1 to 50%, preferably 20 to 45%
Component (C): 0 to 60%, preferably 20 to 50%
Component (D): 0 to 50%, preferably 1 to 20%
Component (E): 0 to 98%, preferably 0 to 10%
Component (J): 2 to 98%, preferably 2 to 10%
Component (K): 0.1 to 98%, preferably, 5 to 40%

Examples of a method of mixing the components in production of the curable resin composition of the present invention that may be employed include: a solution mixing method involving uniformly dissolving or dispersing the components in a solvent; and a blend method involving stirring or mixing the components by using a Henschel mixer or the like. Examples of the solvent to be used in solution mixing include: an aromatic solvent such as benzene, toluene, or xylene; tetrahydrofuran; and a mixture of two or more kinds thereof. The curable resin composition of the present invention may be formed into a desired shape in advance in accordance with its application. The forming method is not particularly limited. Typical examples of the forming method include: a casting method involving dissolving the resin composition in the above-mentioned solvent and forming the resultant into a predetermined shape; and a heat-melting method involving heat-melting the resin composition and forming the resultant into a predetermined shape.

The curable resin composition of the present invention is cured, to thereby obtain a cured product. A curing method is arbitrary, and a method of curing by heat, light, electron beam, or the like may be employed. In curing by heat, a curing temperature is selected within a range of 80 to 300° C., and more preferably 120 to 250° C. although varying depending on the kind of radical initiator. A curing time is about 1 minute to 10 hours, and more preferably 1 minute to 5 hours.

The curable resin composition of the present invention may be attached with a metal foil (including a metal sheet, the same applies below), similar to a cured composite material described below.

Next, description will be given of a curable composite material formed of the curable resin composition of the present invention and a cured product of the curable composite material. The curable composite material formed of the curable resin composition of the present invention includes a substrate added for enhancing mechanical strength and increasing dimensional stability.

Examples of the substrate include: various glass cloths such as a roving cloth, a cloth, a chopped mat, and a surfacing mat; an asbestos cloth; a metal fiber; other synthetic or natural inorganic fiber cloths; woven fabrics or nonwoven fabrics obtained from liquid crystal fibers such as a wholly aromatic polyamide fiber, a wholly aromatic polyester fiber, and a polybenzazole fiber; woven fabrics or nonwoven fabrics obtained from synthetic fibers such as a polyvinyl alcohol fiber, a polyester fiber, and an acrylic fiber; natural fiber cloths such as a cotton cloth, a hemp cloth, and a felt; and cloths and papers such as a carbon fiber cloth and a natural cellulose-based cloth formed of craft paper, cotton paper, or paper/glass mixed fiber paper. The substrate may be used alone or two or more kinds thereof may be used in combination.

A ratio of the substrate is 5 to 90 wt %, preferably 10 to 80 wt %, and more preferably 20 to 70 wt % in the curable composite material. A ratio of the substrate of less than 5 wt % undesirably provides insufficient dimensional stability and strength after curing of the composite material, and a ratio thereof of more than 90 wt % undesirably degrades dielectric properties of the composite material.

The curable composite material of the present invention may include a coupling agent as required for improving adhesiveness at an interface between the resin and the substrate. Examples of the coupling agent include general coupling agents such as a silane coupling agent, a titanate coupling agent, an aluminum-based coupling agent, and a zircoaluminate coupling agent.

An example of a method of producing the curable composite material of the present invention involves: uniformly dissolving or dispersing the curable resin composition of the present invention and other components as required into the aromatic, ketone-based, or other solvents or a mixed solvent thereof; impregnating the substrate therewith; and drying the whole. The impregnation is performed through dipping, application, or the like. The impregnation may be repeated a plurality of times as required. In this case, the impregnation may be repeated by using a plurality of solutions having different compositions or concentrations, to thereby adjust to the desired resin composition and resin amount eventually.

The curable composite material of the present invention is cured through a method such as heating, to thereby obtain a cured composite material. A method of producing the cured composite material is not particularly limited. A cured composite material having a desired thickness may be obtained by: piling a plurality of curable composite materials; and bonding between layers under heating and pressure and heat-curing the same simultaneously. The cured composite material bonded and cured once may be combined with the curable composite material, to thereby obtain a cured composite material having a new layered structure. The laminate forming and curing are performed simultaneously by using a heat press, in general, but the laminate forming and curing may be performed separately. That is, a uncured or semi-cured composite material obtained through laminate forming in advance may be cured through heat treatment or another treatment.

The forming and curing may be performed at a temperature of 80 to 300° C., a pressure of 0.1 to 1,000 kg/cm$^2$, and a time of 1 minute to 10 hours, and preferably at a temperature of 150 to 250° C., a pressure of 1 to 500 kg/cm$^2$, and a time of 1 minute to 5 hours.

A laminate of the present invention is formed of a layer of the cured composite material of the present invention and a metal foil layer. Examples of the metal foil to be used herein include a copper foil and an aluminum foil. A thickness of the metal foil is not particularly limited, but falls within a range of 3 to 200 µm, and more preferably 3 to 105 µm.

An example of a method of producing the laminate of the present invention involves: laminating the curable composite material obtained from the curable resin composition of the present invention and the substrate described above, and a metal foil into a layered structure in accordance with the purpose; and bonding between the layers under heating and pressure and heat curing the whole simultaneously. In the laminate of the curable resin composition of the present invention, the cured composite material and the metal foil are laminated into an arbitrary layered structure. The metal foil may be used as a surface layer or an intermediate layer. In addition, the lamination and curing may be repeated a plurality of times for multilamination.

An adhesive may be used for bonding of the metal foil. Examples of the adhesive include an epoxy-based adhesive, an acrylic adhesive, a phenol-based adhesive, and a cyanoacrylate-based adhesive, but the adhesive is not particularly limited to the examples. The laminate forming and curing may be performed under the same conditions as those for production of the cured composite material of the present invention.

The film of the present invention is obtained by forming the curable resin composition of the present invention into a film. A thickness of the film is not particularly limited, but falls within a range 0.5 to 200 µm, and more preferably 5 to 105 µm.

A method of producing the film of the present invention is not particularly limited, and an example of the method involves: uniformly dissolving or dispersing the curable resin composition and other components as required in an aromatic, ketone-based, or other solvents or a mixed solvent thereof; applying the resultant to a resin film such as a PET film; and drying the whole. The application may be repeated a plurality of times as required. In this case, the application may be repeated by using a plurality of solutions having different compositions or concentrations, to thereby adjust to the desired resin composition and resin amount eventually.

The metal foil provided with a resin is formed of the curable resin composition of the present invention and a metal foil. Examples of the metal foil to be used herein include a copper foil and an aluminum foil. A thickness of the metal foil is not particularly limited, but falls within a range of 0.5 to 200 µm, and more preferably 5 to 105 µm.

A method of producing the metal foil provided with a resin of the present invention is not particularly limited, and an example of the method involves: uniformly dissolving or dispersing the curable resin composition and other components as required into an aromatic, ketone-based, or other solvents or a mixed solvent thereof; applying the resultant to a metal foil; and drying the whole. The application may be repeated a plurality of times as required. In this case, the application may be repeated by using a plurality of solutions having different compositions or concentrations, to thereby adjust to the desired resin composition and resin amount eventually.

BEST MODE FOR CARRYING OUT THE INVENTION

Next, the present invention will be described by using examples, but the present invention is not limited to the examples. Note that any part in the examples represents parts by weight. Further, measurement results in the examples were obtained in sample preparation and measurement through methods described below.

1) Molecular Weight and Molecular Weight Distribution of Polymer

Measurement of a molecular weight and a molecular weight distribution of a soluble polyfunctional vinyl aromatic copolymer was performed by using GPC (HLC-8120GPC, manufactured by Tosoh Corporation) and by using tetrahydrofuran (THF) as a solvent at a flow rate of 1.0 ml/minute and a column temperature of 40° C. The molecular weight of the copolymer was measured as a molecular weight in polystyrene equivalents by using a calibration curve of monodisperse polystyrene.

2) Structure of Polymer

A structure of the copolymer was determined through $^{13}$C-NMR and $^{1}$H-NMR analysis by using a nuclear magnetic resonance spectrometer (JNM-LA600, manufactured by JOEL Ltd). Chloroform-$d_1$ was used as a solvent, and a resonance line of tetrachloroethane-$d_2$ which is a solvent for NMR measurement was used as an internal standard.

3) Sample Preparation and Measurement of Glass Transition Temperature (Tg) and Softening Temperature A solution of a curable resin composition was uniformly applied to a glass substrate such that a thickness after drying was 20 μm. Then, the whole was heated at 90° C. for 30 minutes by using a hot plate and dried. The obtained resin film on the glass substrate was set in a thermomechanical analysis (TMA) apparatus together with the glass substrate. The whole was heated to 220° C. at a temperature increase rate of 10° C./minute in a stream of nitrogen and was subjected to heat treatment at 220° C. for 20 minutes, to thereby remove the remaining solvent. The glass substrate was left standing to cool to room temperature. Then, an analysis probe was brought into contact with the sample in the TMA apparatus, and measurement was performed by scanning from 30° C. to 360° C. at a temperature increase rate of 10° C./minute in a stream of nitrogen, to thereby determine a softening temperature through a tangent method. Further, Tg was determined from an inflection point where a linear coefficient of expansion varies.

Measurement of Tg of a cured film obtained through heat press forming was performed at a temperature increase rate of 2° C./minute by using a dynamic viscoelasticity measurement apparatus, and Tg was determined from a peak of loss elastic modulus.

4) Tensile Strength and Stretch Rate

Tensile strength and stretch rate were measured by using a tensile testing apparatus. The stretch rate was measured from a chart obtained in a tensile test.

5) Peel Strength of Copper Foil

A sample piece with a width of 20 mm and a length of 100 mm was cut out from a laminate, and parallel cuts of 10 mm apart were made on a copper foil surface. The copper foil was continuously peeled off at a rate of 50 mm/minute in a direction of 180° with respect to the surface. Tension at this time was measured with a tensile testing apparatus, and a minimum value of the tension was determined (in accordance with JIS C6481).

6) Dielectric Constant and Dielectric Dissipation Factor

Dielectric constant and dielectric dissipation factor were measured at a frequency of 100 MHz to 1 GHz by using an impedance analyzer.

7) Formability

An uncured film of the curable resin composition was laminated on a copper-clad laminate sheet subjected to blackening treatment, and vacuum lamination was performed at a temperature of 110° C. and a pressure of 0.1 MPa with a vacuum laminator. Then, a bonding state of the blackened copper foil and the film was evaluated. The results of the evaluation were represented by: "○" for a favorable bonding state of the blackened copper foil and the film; and "x" for a bonding state in which the blackened copper foil and the film were able to be easily peeled off.

8) Average Interlayer Distance of Layered Silicate

2θ of a diffraction peak obtained through diffraction of a laminate surface of a layered silicate in a sheet formed product having a thickness of 2 mm was measured by using an X-ray diffraction measurement apparatus (RINT1100, manufactured by Rigaku Corporation). A spacing (d) of a (001) plane of the layered silicate was calculated from the Bragg's equation, and the obtained d was referred to as an average interlayer distance (nm).

$$\lambda = 2d \sin\theta \quad (4)$$

In the equation: λ is 1.54; d represents a spacing of the layered silicate; and θ represents a diffraction angle.

9) Ratio of Layered Silicate Dispersed in Five or Less Layers

The layered silicate was observed at a magnification of 50,000 to 100,000 with a transmission electron microscope. The number of layers (Y) of the layered silicate dispersed in five or less layers out of the number of all layers (X) of the laminate of the layered silicate that can be observed in a certain area was measured, and a ratio P(%) of the layered silicate dispersed in five or less layers was calculated from the following equation.

Ratio $P(\%)$ of layered silicate dispersed as five or less layers = $(Y/X) \times 100$ 10) Flammability A flammability test was performed in accordance with a vertical flame test method of UL standard, Subject 94 (UL94), and flame retardance was evaluated.

12) Surface Properties

The formed product was observed with a stereomicroscope, and surface properties of the formed product were evaluated into three levels depending on smoothness of the surface.

○: high smoothness, favorable surface properties
Δ: small irregularities, slightly degraded smoothness
x: large irregularities, degraded smoothness

13) DTUL

Measurement was performed in accordance with ASTM D648. Load of 18.6 Kg/cm$^2$

EXAMPLES

Synthesis Example 1

0.481 mol (68 ml) of divinylbenzene, 0.362 mol (52 ml) of ethylvinylbenzene, 47 ml of a dichloroethane solution (concentration: 0.634 mmol/ml) of 1-chloroethylbenzene (30 mmol), 65 ml of a dichloroethane solution (concentration: 0.035 mmol/ml) of n-tetrabutylammonium chloride (2.25 mmol), and 500 ml of dichloroethane (dielectric constant: 10.3) were charged into a 1,000 ml-flask. 22 ml of a dichloroethane solution (concentration: 0.068 mmol/ml) having 1.5 mmol of SnCl$_4$ was added to the mixture at 70° C., and the whole was reacted for an hour. A polymerization reaction was stopped with a small amount of methanol subjected to bubbling with nitrogen. Then, the reaction mixture was charged into a large amount of methanol, to thereby precipitate a polymer. The obtained polymer was washed with methanol, separated through filtration, dried, and weighed, to thereby obtain 67.4 g (yield: 61.4 wt %) of a copolymer A. A polymerization activity was 44.9 (g polymer/mmolSn·hr).

The obtained copolymer A had Mw of 7,670, Mn of 3,680, and Mw/Mn of 2.1. $^{13}$C-NMR and $^1$H-NMR analysis revealed that the copolymer-1 contained 51 mol % of a structural unit derived from divinylbenzene and 49 mol % of a structural unit derived from ethylvinylbenzene. The copolymer A had an indan structure. A ratio of the indan structure presents at 7.5 mol % with respect to the structural units of all monomers. A mole fraction of structural units represented by the general formula (a1) was 0.99 with respect to the total amount of structural units represented by the general formulae (a1) and (a2). The results of TMA measurement revealed that Tg was 290° C. and a softening temperature was 300° C. or higher. The results of TGA measurement revealed that a heat decomposition temperature was 417° C. and a carbonization yield was 28%.

The copolymer A was soluble in toluene, xylene, THF, dichloroethane, dichloromethane, and chloroform, and no gelling was observed. A cast film of the copolymer A was a transparent film without cloudiness.

Synthesis Example 2

0.481 mol (68.4 ml) of divinylbenzene, 0.0362 mol (5.16 ml) of ethylvinylbenzene, 63 ml of a dichloroethane solution (concentration: 0.634 mmol/ml) of 1-chloroethylbenzene (40 mmol), 11 ml of a dichloroethane solution (concentration: 0.135 mmol/ml) of n-tetrabutylammonium bromide (1.5 mmol), and 500 ml of dichloroethane (dielectric constant: 10.3) were charged into a 1,000 ml-flask. 1.5 ml of a dichloroethane solution (concentration: 0.068 mmol/ml) having 1.5 mmol of SnCl$_4$ was added to the mixture at 70° C., and the whole was reacted for an hour. A polymerization reaction was stopped with a small amount of methanol subjected to bubbling with nitrogen. Then, the reaction mixture was charged into a large amount of methanol, to thereby precipitate a polymer. The obtained polymer was washed with methanol, separated through filtration, dried, and weighed, to thereby obtain 54.6 g (yield: 49.8 wt %) of a copolymer B. A polymerization activity was 49.8 (g polymer/mmolSn·hr).

The obtained copolymer B had Mw of 4,180, Mn of 2,560, and Mw/Mn of 1.6. $^{13}$C-NMR and $^1$H-NMR analysis revealed that the copolymer-1 contained 52 mol % of a structural unit derived from divinylbenzene and 48 mol % of a structural unit derived from ethylvinylbenzene. The copolymer B had an indan structure. A ratio of the indan structure presents at 7.5 mol % with respect to the structural units of all monomers. A mole fraction of structural units represented by the general formula (a1) was 0.99 with respect to the total amount of structural units represented by the general formulae (a1) and (a2). The results of TMA measurement revealed that Tg was 287° C. and a softening temperature was 300° C. or higher. The results of TGA measurement revealed that a heat decomposition temperature was 413° C. and a carbonization yield was 26%.

The copolymer B was soluble in toluene, xylene, THF, dichloroethane, dichloromethane, and chloroform, and no gelling was observed. A cast film of the copolymer B was a transparent film without cloudiness.

Abbreviations of components used in Examples are shown below.

PPE: polyphenylene ether having a limiting viscosity of 0.45 (available from Mitsubishi Gas Chemical Company, Inc.)

OPE-2St-1: polyphenylene oligomer having a vinyl group on each terminal (Mn=1,160, available from Mitsubishi Gas Chemical Company, Inc., a reaction product of 2,2',3,3',5,5'-hexamethylbiphenyl-4,4'-diol/2,6-dimethylphenol condensate and chloromethylstyrene)

OPE-2St-2: polyphenylene oligomer having a vinyl group on each terminal (Mn=2,270, available from Mitsubishi Gas Chemical Company, Inc., a reaction product of 2,2',3,3',5,5'-hexamethylbiphenyl-4,4'-diol/2,6-dimethylphenol condensate and chloromethylstyrene)

OPE-2St-3: polyphenylene oligomer having a vinyl group on each terminal (Mn=3,560, available from Mitsubishi Gas Chemical Company, Inc., a reaction product of 2,2',3,3',5,5'-hexamethylbiphenyl-4,4'-diol/2,6-dimethylphenyl condensate and chloromethylstyrene)

Reaction Initiator Agent

P-1: 2,5-dimethyl-2,5-bis(t-butylperoxy)hexane (PERHEXA 25B, trade name, available from NOF CORPORATION.)

Thermoplastic Resin

T-1: Hydrogenated styrene butadiene block copolymer (TAFTEC H1041, trade name, available from Asahi Kasei Corporation.)

T-2: Hydrogenated styrene butadiene block copolymer (KRATON G1652, trade name, available from KRATON Polymers Japan Ltd.)

T-3: Hydrogenated styrene isoprene block copolymer (KRATON G1726, trade name, available from KRATON Polymers Japan Ltd.)

T-4: Styrene butadiene block copolymer (TAFPLANE 315P, trade name, available from Asahi Kasei Corporation.)

T-6: Hydrogenated styrene butadiene block copolymer (KRATON GRP6935, trade name, available from KRATON Polymers Japan Ltd.)

T-7: Hydrogenated styrene isoprene block copolymer (KRATON G1730, trade name, available from KRATON Polymers Japan Ltd.)

Thermosetting Resin

E-1: Epoxy resin represented by the following formula (EOCN-1020, trade name, available from NIPPON KAYAKU CO., LTD.):

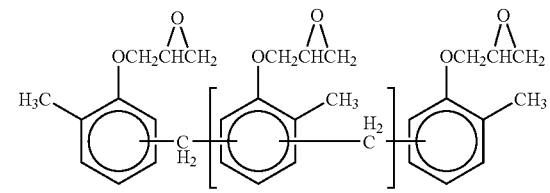

E-2: Epoxy resin represented by the following formula (ZX-1627, trade name, available from Tohto Kasei Co., LTD.):

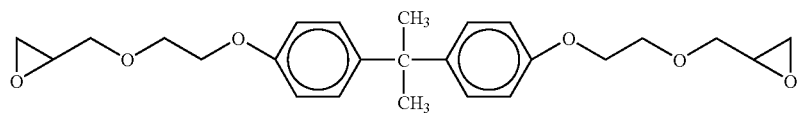

E-3: Epoxy resin represented by the following formula (YD-128, trade name, available from Tohto Kasei Co., LTD.):

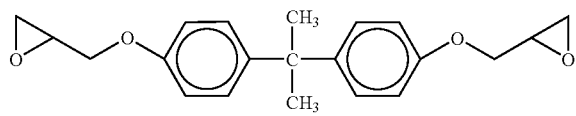

E-4: Epoxy resin represented by the following formula (YD-8170, trade name, available from Tohto Kasei Co., LTD.):

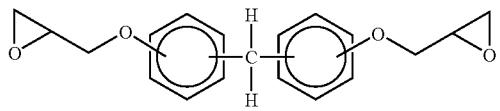

E-5: Epoxy resin represented by the following formula (ZX-1658, trade name, available from Tohto Kasei Co., LTD.):

E-6: Triallyl isocyanurate (AIONIX M-315, trade name, available from TOAGOSEI CO., LTD.)

E-7: Liquid bisphenol A type epoxy resin (EPICOAT 828, trade name, available from Japan Epoxy Resins Co., Ltd.)

Spherical silica: average grain diameter: 0.5 μm (ADMA-FINE S0-C2, trade name, available from Admatechs.)

Calcium carbonate: calcium carbonate with average grain diameter of 0.5 μm

Layered Silicate

LS-1: synthetic hectorite subjected to organification treatment with a trioctylmethylammonium salt (Lucentite STN, available from CO-OP Chemical Co., Ltd.)

LS-2: swelling fluorine mica subjected to organification treatment with a distearyidimethyl quaternary ammonium salt (Somasif MAE-100, available from CO-OP Chemical Co., Ltd.)

LS-3: natural montmorillonite subjected to organification treatment with a distearyldimethyl quaternary ammonium salt (New S-Ben D, available from Hojun Co., Ltd.)

Curing Catalyst

C-1: 2-ethyl-4-methylimidazole (Curezol 2E4MZ, available from Shikoku Corporation)

C-2: 1-cyanoethyl-2-methylimidazole (Curezol 2MZ-CN, available from Shikoku Corporation)

Halogen-Based Flame Retardant

F-1: Ethane-1,2-bis(pentabromophenyl) (SAYTEX 8010, available from Albemarle Corporation.)

F-2: Brominated polystyrene having an atactic structure (Fire Master PBS-64HW, available from Great Lakes Chemical Corporation.)

F-3: Polydibromophenylene oxide (Pyroguard SR-460B, Daiichi FR Corporation.)

F-4: Octabromotrimethylfenyl indan (SAYTEX 8010, available from Albemarle Corporation.)

F-5: Brominated epoxy compound (BROC, trade name, available from NIPPON KAYAKU CO., LTD.)

Example 1

The copolymers A and B obtained in Synthesis Examples described above, PPE, OPE-2St-1 to 3, the reaction initiator P-1, the thermoplastic resin T-1, and the heat-curable resin E-7 were mixed in amounts described in Table 1 with toluene as a solvent. The mixture was stirred, and the reaction initiator P-1 was added, to thereby prepare a solution of a heat-curable resin composition.

The solution of a heat-curable resin composition was cast on a board having a polyethylene terephthalate resin (PET) sheet attached, to thereby obtain a film. The obtained film had a thickness of about 50 to 60 μm, was not sticky and the like, and had excellent film formation property. This film was dried at 80° C. for 10 minutes in an air oven, and heat-cured at 180° C. for 1 hour with a vacuum press forming machine, to thereby obtain a cured film having a thickness of about 50 μm.

This cured film was measured for tensile strength, stretch rate, dielectric constant, and dielectric dissipation factor. Table 1 shows the results.

TABLE 1

|  | Experiment No. | | | |
|---|---|---|---|---|
|  | 1 | 2 | 3 | 4 |
| Copolymer A (wt %) | 18.5 |  | 18.5 | 18.5 |
| Copolymer B (wt %) |  | 18.5 |  |  |
| OPE-2St-1 (wt %) | 36.5 | 36.5 |  |  |
| OPE-2St-2 (wt %) |  |  | 36.5 |  |
| OPE-2St-3 (wt %) |  |  |  | 36.5 |
| T-1 (wt %) | 40.0 | 40.0 | 40.0 | 40.0 |
| E-1 (wt %) | 5.0 | 5.0 | 5.0 | 5.0 |
| P-1 (phr) | 4.0 | 4.0 | 4.0 | 4.0 |
| Tensile strength (kgf/mm$^2$) | 4.20 | 4.11 | 3.77 | 3.51 |
| Stretch at tensile break (%) | 21.1 | 19.5 | 20.1 | 39.0 |
| Copper foil peeling strength (kgf/cm) | 1.01 | 1.05 | 1.03 | 0.97 |
| Glass transition temperature (° C.) | 204.2 | 202.6 | 197.6 | 199.3 |
| Softening temperature (° C.) | >300 | >300 | >300 | >300- |
| Dielectric constants (1.0 GHz) | 2.35 | 2.37 | 2.39 | 2.36 |
| Dielectric dissipation factor (1.0 GHz) | 0.0045 | 0.0042 | 0.0051 | 0.0058 |
| Formability | ○ | ○ | ○ | ○ |

Comparative Example 1

The copolymer A obtained in Synthesis Example described above, PPE, the reaction initiator P-1, the thermoplastic resin T-1, and the heat-curable resin E-6 were mixed in amounts described in Table 2 with toluene as a solvent. The mixture was stirred, and the reaction initiator P-1 was added, to thereby prepare a solution of a heat-curable resin composition.

The solution of a heat-curable resin composition was cast on a board having a polyethylene terephthalate (PET) resin sheet attached, to thereby obtain a film. The obtained film had a thickness of about 50 to 60 μm, was not sticky and the like, and had excellent film formation property. This film was dried at 80° C. for 10 minutes in an air oven, and heat-cured at 180° C. for 1 hour with a vacuum press forming machine, to thereby obtain a cured film having a thickness of about 50 μm.

This cured film was measured for tensile strength, stretch rate, dielectric constant, and dielectric dissipation factor. Table 2 shows the results.

TABLE 2

| | Comparative Experiment No. | | |
|---|---|---|---|
| | 1 | 2 | 3 |
| Copolymer A (wt %) | 18.5 | | |
| PPE (wt %) | 36.5 | | 36.5 |
| OPE-2St-1 (wt %) | | 36.5 | |
| T-1 (wt %) | 40.0 | 40.0 | 40.0 |
| E-1 (wt %) | 5.0 | | |
| E-6 (wt %) | | 23.5 | 23.5 |
| P-1 (phr) | 4.0 | 4.0 | 4.0 |
| Tensile strength (kgf/mm$^2$) | 4.07 | 3.26 | 2.69 |
| Stretch at tensile break (%) | 27.1 | 3.5 | 9.1 |
| Copper foil peeling strength (kgf/cm) | 0.74 | 0.47 | 0.53 |
| Glass transition temperature (° C.) | 188.5 | 165.8 | 172.3 |
| Softening temperature (° C.) | >300 | >300 | >300 |
| Dielectric constants (1.0 GHz) | 2.43 | 2.78 | 2.76 |
| Dielectric dissipation factor (1.0 GHz) | 0.0078 | 0.014 | 0.013 |
| Formability | x | ○ | x |

Example 2

Solutions of heat-curable resin compositions were prepared in the same manner as in Example 1 expect that the thermoplastic resins T-2 and T-3, the heat-curable resins E-1 to E-6, spherical silica S, and PPE were used, and films were obtained from the solutions of heat-curable resin compositions. The films were each subjected to various evaluations. Tables 3 to 5 show the results.

TABLE 3

| | Experiment No. | | | |
|---|---|---|---|---|
| | 5 | 6 | 7 | 8 |
| Copolymer B (wt %) | 18.5 | 18.5 | 18.5 | 18.5 |
| OPE-2St-1 (wt %) | 36.5 | 36.5 | 36.5 | 34.5 |
| PPE (wt %) | | | | 2.0 |
| T-2 (wt %) | 40.0 | 30.0 | | 40.0 |
| T-3 (wt %) | | 10.0 | | |
| T-4 (wt %) | | | 40.0 | |
| E-1 (wt %) | 5.0 | 5.0 | 5.0 | 5.0 |
| Reaction initiator P-1 (phr) | 4.0 | 4.0 | 4.0 | 4.0 |
| Tensile strength (kgf/mm$^2$) | 3.78 | 4.03 | 3.89 | 4.22 |
| Stretch at tensile break (%) | 19.4 | 15.3 | 26.5 | 22.0 |
| Copper foil peeling strength (kgf/cm) | 1.08 | 0.96 | 0.99 | 1.07 |
| Glass transition temperature (° C.) | 202.3 | 198.7 | 192.1 | 201.4 |
| Softening temperature (° C.) | >300 | >300 | >300 | >300- |
| Dielectric constants (1.0 GHz) | 2.38 | 2.35 | 2.37 | 2.34 |
| Dielectric dissipation factor (1.0 GHz) | 0.0051 | 0.0048 | 0.0045 | 0.0053 |
| Formability | ○ | ○ | ○ | ○ |

TABLE 4

| | Experiment No. | | | |
|---|---|---|---|---|
| | 9 | 10 | 11 | 12 |
| Copolymer B (wt %) | 18.5 | 18.5 | 18.5 | 18.5 |
| OPE-2St-1 (wt %) | 36.5 | 36.5 | 36.5 | 34.5 |
| PPE (wt %) | | | | 2.0 |
| T-2 (wt %) | 40.0 | 40.0 | 40.0 | 40.0 |
| E-2 (wt %) | 5.0 | | | |
| E-3 (wt %) | | 5.0 | | |
| E-4 (wt %) | | | 5.0 | |
| E-5 (wt %) | | | | 5.0 |
| P-1 (phr) | 4.0 | 4.0 | 4.0 | 4.0 |
| Tensile strength (kgf/mm$^2$) | 3.64 | 3.45 | 3.71 | 4.17 |
| Stretch at tensile break (%) | 16.5 | 15.7 | 18.9 | 23.1 |
| Copper foil peeling strength (kgf/cm) | 1.01 | 0.97 | 0.95 | 1.03 |

TABLE 4-continued

| | Experiment No. | | | |
|---|---|---|---|---|
| | 9 | 10 | 11 | 12 |
| Glass transition temperature (° C.) | 196.3 | 193.5 | 192.7 | 200.4 |
| Softening temperature (° C.) | >300 | >300 | >300 | >300- |
| Dielectric constants (1.0 GHz) | 2.41 | 2.39 | 2.40 | 2.33 |
| Dielectric dissipation factor (1.0 GHz) | 0.0065 | 0.0058 | 0.0062 | 0.0050 |
| Formability | ○ | ○ | ○ | ○ |

TABLE 5

| | Experiment No. | | | |
|---|---|---|---|---|
| | 13 | 14 | 15 | 16 |
| Copolymer B (wt %) | 27.5 | 18.5 | 17.5 | 16.0 |
| OPE-2St-1 (wt %) | 25.5 | 31.5 | 33.5 | 32.0 |
| PPE (wt %) | 2.0 | 5.0 | 2.0 | 2.0 |
| T-2 (wt %) | 40.0 | 38.0 | 40.0 | 40.0 |
| E-5 (wt %) | 5.0 | 5.0 | 5.0 | 5.0 |
| E-6 (wt %) | | 2.0 | | |
| Spherical silica (wt %) | | | 2.0 | 5.0 |
| P-1 (phr) | 4.0 | 4.0 | 4.0 | 4.0 |
| Tensile strength (kgf/mm$^2$) | 3.88 | 3.44 | 4.31 | 4.58 |
| Stretch at tensile break (%) | 19.2 | 13.4 | 16.5 | 11.2 |
| Copper foil peeling strength (kgf/cm) | 0.90 | 0.89 | 1.02 | 1.00 |
| Glass transition temperature (° C.) | 201.5 | 189.7 | 201.3 | 204.6 |
| Softening temperature (° C.) | >300 | >300 | >300 | >300- |
| Dielectric constants (1.0 GHz) | 2.33 | 2.41 | 2.44 | 2.47 |
| Dielectric dissipation factor (1.0 GHz) | 0.0047 | 0.0081 | 0.0055 | 0.0062 |
| Formability | ○ | ○ | ○ | ○ |

Example 3

A glass cloth (E glass, weight of 71 g/m$^2$) was dipped in the solution of a heat-curable resin composition obtained in Experiment No. 2 of Example 1 for impregnation, and the whole was dried in an air oven at 50° C. for 30 minutes. The obtained prepreg had a resin content (R.C) of 69%.

Core materials each having through-holes with a diameter of 0.35 mm arranged at 5 mm pitch and having a thickness of 0.8 mm were attached by using this prepreg, and the number of through-holes without the resin filled therein was 0 out of 4,500 holes.

A plurality of the curable composite materials were piled as required such that a thickness after forming was about 0.6 mm to 1.0 mm. A copper foil having a thickness of 35 μm was placed on each side of the pile, and the whole was formed and cured with a press forming machine, to thereby obtain a laminate. The curing conditions for each of Examples include: a temperature increase rate of 3° C./minute; holding at 180° C. for 90 minutes; and a pressure of 30 kg/cm$^2$.

The physical properties of the thus-obtained laminate were measured through the following methods.
1) Trichloroethylene resistance: A laminate having the copper foils removed therefrom was cut out into 25 mm square, and was boiled in trichloroethylene for 5 minutes. The change in appearance was visually observed (in accordance with JIS C6481).
2) Solder heat resistance: A laminate having the copper foils removed therefrom was cut out into 25 mm square, and was floated in a solder bath at 260° C. for 120 seconds. The change in appearance was visually observed (in accordance with JIS C6481).

No changes in appearance of the laminate were observed in a trichloroethylene resistance test. The laminate had Tg of 217° C. No changes in appearance of the laminate were observed in a solder heat resistance test. The laminate had a dielectric constant of 2.57 and a dielectric dissipation factor of 0.0044.

Example 4

The solution of Experiment No. 16 was applied onto an electrolytic copper foil of 18 μm. Then, the whole was air-dried for 10 minutes and dried at 80° C. for 10 minutes in an air oven. A thickness of a resin on the copper foil was 50 μm. The copper foil having a resin and the core material of Example 3 were piled, and the whole was cured under heating at 180° C. and a pressure of 30 kg/cm$^2$ for 90 minutes. No through-holes without the resin filled therein were observed.

Example 5

The copolymer B obtained in Synthesis Example described above, synthetic hectorite subjected to organification treatment with a trioctylmethylammonium salt (Lucentite STN, available from CO-OP Chemical Co., Ltd.) as the layered silicate LS-1, the thermoplastic resin T-1, the liquid bisphenol-A epoxy resin (Epicoat 828, available from Japan Epoxy Resins Co., Ltd.) E-7 as a heat-curable resin, and PPE as another thermoplastic resin were used. Those compounds in amounts described in Table 1 were mixed with toluene as a solvent. The mixture was stirred, and the reaction initiator P-1 was added, to thereby prepare a solution of a heat-curable resin composition.

The obtained solution of a heat-curable resin composition was cast on a PET sheet, to thereby obtain a film having a thickness of about 15 μm. The obtained film was not sticky and the like and had excellent film formation property. This film was dried at 80° C. for 10 minutes in an air oven. Then, a PET sheet was laminated on the cast surface, and the whole was cured in an air oven at 180° C., to thereby obtain a cured film.

2θ of a diffraction peak obtained through diffraction of a laminate surface of a layered silicate in a sheet formed product having a thickness of 2 mm was measured by using an average interlayer distance X-ray diffraction measurement apparatus (RINT1100, manufactured by Rigaku Corporation). A spacing (d) of a (001) plane of the layered silicate was calculated from the Bragg's equation of the follow formula (16), and the obtained d was referred to as an average interlayer distance (nm).

$$\lambda = 2d \sin \theta \qquad (16)$$

In the equation (16): λ is 1.54; and θ represents a diffraction angle.

A sheet formed product with a thickness of 100 μm of the layered silicate dispersed as a laminate of five or less layers was observed at a magnification of 100,000 with a transmission electron microscope. The number of total layers X of the laminate of the layered silicate and the number of layers Y of the layered silicate dispersed in five or less layers that can be observed in a certain area were measured, and a ratio P(%) of the layered silicate dispersed as a laminate of five or less layers was calculated from the following equation (17).

$$P(\%) = (Y/X) \times 100 \qquad (17)$$

This cured film was measured for tensile strength, stretch rate, dielectric constant, and dielectric dissipation factor. Table 6 shows the results.

TABLE 6

| | Experiment No. | | | |
|---|---|---|---|---|
| | 1 | 2 | 3 | 4 |
| Copolymer B (wt %) | 18.1 | 17.6 | 16.8 | 15.4 |
| OPE-2St-1 (wt %) | 33.8 | 32.9 | 31.4 | 28.7 |
| PPE (wt %) | 2.0 | 1.9 | 1.8 | 1.7 |
| T-1 (wt %) | 39.2 | 38.1 | 36.4 | 33.3 |
| E-7 (wt %) | 4.9 | 4.8 | 4.5 | 4.2 |
| LS-1 (wt %) | 2.0 | 4.8 | 9.1 | 16.7 |
| P-1 (phr) | 4.0 | 3.8 | 3.6 | 3.4 |
| Average interlayer distance (nm) | 3.5< | 3.5< | 3.5< | 3.5< |
| P (%) | 10< | 10< | 10< | 10< |
| Tensile strength (kgf/mm$^2$) | 4.54 | 4.55 | 4.57 | 4.15 |
| Stretch at tensile break (%) | 18.1 | 15.3 | 13.6 | 8.4 |
| Tensile modulus of elasticity (kgf/mm$^2$) | 75.1 | 79.6 | 84.4 | 109.4 |
| Copper foil peeling strength (kgf/cm) | 0.95 | 0.91 | 0.87 | 0.81 |
| Glass transition temperature (° C.) | 208.1 | 208.4 | 207.3 | 205.7 |
| Softening temperature (° C.) | >300 | >300 | >300 | >300- |
| Dielectric constants (1.0 GHz) | 2.37 | 2.45 | 2.57 | 2.54 |
| Dielectric dissipation factor (1.0 GHz) | 0.0053 | 0.0049 | 0.0065 | 0.0053 |
| Formability | ○ | ○ | ○ | ○ |

Comparative Example 2

A heat-curable resin composition was evaluated in the same manner as in Example 1 except that a film having a thickness of about 15 μm was formed by casting, on a PET sheet, a solution of a heat-curable resin composition prepared by using the copolymer B, the layered silicate, PPE, the reaction initiator P-1, the thermoplastic resin T-1, the heat-curable resin E-7, and calcium carbonate having an average particle size of 50 μm. Table 7 shows the results.

TABLE 7

| | Comparative Experiment No. | | |
|---|---|---|---|
| | 1 | 2 | 3 |
| Copolymer B (wt %) | 18.5 | | 17.6 |
| OPE-2St-1 (wt %) | 36.5 | 50.5 | 32.9 |
| PPE (wt %) | 2.0 | 1.9 | 1.9 |
| T-1 (wt %) | 40.0 | 38.1 | 38.1 |
| E-1 (wt %) | 5.0 | 4.8 | 4.8 |
| LS-1 (wt %) | | 4.8 | |
| Calcium carbonate (wt %) | | | 4.8 |
| P-1 (phr) | 4.0 | 3.8 | 3.8 |
| Average interlayer distance (nm) | | 3.5< | |
| P (%) | | 10< | |
| Tensile strength (kgf/mm$^2$) | 4.38 | 3.86 | 3.26 |
| Stretch at tensile break (%) | 20.5 | 7.8 | 4.3 |
| Tensile modulus of elasticity (kgf/mm$^2$) | 58.1 | 81.5 | 54.1 |
| Copper foil peeling strength (kgf/cm) | 0.91 | 0.67 | 0.41 |
| Glass transition temperature (° C.) | 184.5 | 167.7 | 181.3 |
| Softening temperature (° C.) | >300 | 205.6 | >300 |
| Dielectric constants (1.0 GHz) | 2.32 | 2.64 | 2.71 |
| Dielectric dissipation factor (1.0 GHz) | 0.0057 | 0.0061 | 0.0051 |
| Formability | ○ | ○ | Δ |

Example 6

A heat-curable resin composition was evaluated in the same manner as in Example 5 except that a cured film having a thickness of about 50 μm was obtained by: using swelling fluorine mica subjected to organification treatment with a distearyldimethyl quaternary ammonium salt (Somasif MAE-100, available from CO-OP Chemical Co., Ltd.) as the layered silicate LS-2, and natural montmorillonite-1 subjected to organification treatment with a distearyidimethyl quaternary ammonium salt (New S-Ben D, available from Hojun Co., Ltd.) as the layered silicate LS-3; casting the solution of the heat-curable resin composition on a polyethylene terephthalate resin (PET) sheet; drying the obtained film (thickness of about 50 μm to 60 μm) at 80° C. for 10 minutes in an air oven; and heat-curing the resultant at 180° C. for 1 hour with a vacuum press forming machine. Table 8 shows the results.

TABLE 8

|  | Experiment No. | |
| --- | --- | --- |
|  | 5 | 6 |
| Copolymer B (wt %) | 17.6 | 17.6 |
| OPE-2St-1 (wt %) | 32.9 | 32.9 |
| PPE (wt %) | 1.9 | 1.9 |
| T-1 (wt %) | 38.1 | 38.1 |
| E-7 (wt %) | 4.8 | 4.8 |
| LS-1 (wt %) |  |  |
| LS-2 (wt %) | 4.8 |  |
| LS-3 (wt %) |  | 4.8 |
| P-1 (phr) | 3.8 | 3.8 |
| Average interlayer distance (nm) | 3.5< | 3.5< |
| P (%) | 10< | 10< |
| Tensile strength (kgf/mm$^2$) | 4.32 | 4.27 |
| Stretch at tensile break (%) | 18.7 | 17.1 |
| Tensile modulus of elasticity (kgf/mm$^2$) | 77.4 | 78.3 |
| Copper foil peeling strength (kgf/cm) | 0.85 | 0.91 |
| Glass transition temperature (° C.) | 202.3 | 208.4 |
| Softening temperature (° C.) | >300 | >300 |
| Dielectric constants (1.0 GHz) | 2.34 | 2.38 |
| Dielectric dissipation factor (1.0 GHz) | 0.0057 | 0.0061 |
| Formability | ○ | ○ |

Example 7

A glass cloth (E glass, weight of 71 g/m$^2$) was dipped in the solution of a heat-curable resin composition obtained in Experiment No. 2 of Example 5 for impregnation, and the whole was dried in an air oven at 50° C. for 30 minutes. The obtained prepreg had a resin content (R.C) of 69%.

Core materials each having through-holes with a diameter of 0.35 mm arranged at 5 mm pitch and having a thickness of 0.8 mm were attached by using this prepreg, and the number of through-holes without the resin filled therein was 0 out of 4,500 holes.

A plurality of the curable composite materials were piled as required such that a thickness after forming was about 0.6 mm to 1.0 mm. A copper foil having a thickness of 35 μm was placed on each side of the pile, and the whole was formed and cured with a press forming machine, to thereby obtain a laminate. The curing conditions for each of Examples include: a temperature increase rate of 3° C./minute; holding at 180° C. for 90 minutes; and a pressure of 30 kg/cm$^2$.

The physical properties of the thus-obtained laminate were measured through the above-mentioned methods.

No changes in appearance of the laminate were observed in the trichloroethylene resistance test. The laminate had Tg of 212° C. No changes in appearance of the laminate were observed in the solder heat resistance test. The laminate had a dielectric constant of 2.61 and a dielectric dissipation factor of 0.0042.

Example 8

A cured film obtained from a heat-curable resin composition was evaluated in the same manner as in Example 6 except that the mixing composition was changed to that shown in Table 9. Table 9 shows the results.

TABLE 9

|  | Experiment No. | | | |
| --- | --- | --- | --- | --- |
|  | 9 | 10 | 11 | 12 |
| Copolymer B (wt %) |  | 17.6 | 17.6 | 22.7 |
| Copolymer A (wt %) | 17.6 |  |  |  |
| OPE-2St-1 (wt %) | 32.9 | 32.9 | 31.8 | 30.0 |
| PPE (wt %) | 1.9 | 1.9 | 2.9 | 1.8 |
| T-1 (wt %) | 38.1 |  | 38.1 | 27.3 |
| T-2 (wt %) |  | 38.1 |  |  |
| T-3 (wt %) |  |  |  | 9.1 |
| E-1 (wt %) | 4.8 |  |  | 4.5 |
| E-4 (wt %) |  | 4.8 |  |  |
| E-7 (wt %) |  |  | 4.8 |  |
| LS-1 (wt %) | 4.8 | 4.8 | 4.8 | 4.5 |
| P-1 (phr) | 3.8 | 3.8 | 3.8 | 3.6 |
| Average interlayer distance (nm) | 3.5< | 3.5< | 3.5< | 3.5< |
| P (%) | 10< | 10< | 10< | 10< |
| Tensile strength (kgf/mm$^2$) | 4.43 | 4.62 | 4.28 | 4.56 |
| Stretch at tensile break (%) | 23.2 | 18.6 | 24.2 | 12.2 |
| Tensile modulus of elasticity (kgf/mm$^2$) | 81.6 | 82.3 | 75.3 | 94.7 |
| Copper foil peeling strength (kgf/cm) | 1.01 | 0.94 | 0.98 | 1.12 |
| Glass transition temperature (° C.) | 204.1 | 204.4 | 205.3 | 201.3 |
| Softening temperature (° C.) | >300 | >300 | >300 | >300- |
| Dielectric constants (1.0 GHz) | 2.36 | 2.33 | 2.44 | 2.38 |
| Dielectric dissipation factor (1.0 GHz) | 0.0051 | 0.0059 | 0.0064 | 0.0058 |
| Formability | ○ | ○ | ○ | ○ |

Example 9

A cured film obtained from a heat-curable resin composition was evaluated in the same manner as in Example 6 except that the mixing composition was changed to that shown in Table 10. Table 10 shows the results.

TABLE 10

| | Experiment No. | | | |
|---|---|---|---|---|
| | 13 | 14 | 15 | 16 |
| Copolymer B (wt %) | 17.6 | 17.6 | 17.6 | 17.6 |
| OPE-2St-1 (wt %) | | | 32.9 | 32.9 |
| OPE-2St-2 (wt %) | 32.9 | | | |
| OPE-2St-3 (wt %) | | 32.9 | | |
| PPE (wt %) | 1.9 | 1.9 | 1.9 | 1.9 |
| T-1 (wt %) | 38.1 | | 38.1 | 38.1 |
| T-4 (wt %) | | 38.1 | | |
| E-1 (wt %) | 4.8 | | | 4.8 |
| E-5 (wt %) | | 4.8 | | |
| E-6 (wt %) | | | 4.8 | |
| LS-1 (wt %) | 4.8 | 4.8 | 3.8 | 4.8 |
| Spherical silica (wt %) | | | 1.0 | |
| P-1 (phr) | 3.8 | 3.8 | 3.8 | 3.8 |
| Average interlayer distance (nm) | 3.5< | 3.5< | 3.5< | 3.5< |
| P (%) | 10< | 10< | 10< | 10< |
| Tensile strength (kgf/mm$^2$) | 4.17 | 3.87 | 4.46 | 4.77 |
| Stretch at tensile break (%) | 25.6 | 31.3 | 15.7 | 21.6 |
| Tensile modulus of elasticity (kgf/mm$^2$) | 69.5 | 58.3 | 76.9 | 81.4 |
| Copper foil peeling strength (kgf/cm) | 0.89 | 0.91 | 0.93 | 1.07 |
| Glass transition temperature (° C.) | 197.1 | 193.5 | 201.7 | 198.6 |
| Softening temperature (° C.) | >300 | >300 | >300 | >300- |
| Dielectric constants (1.0 GHz) | 2.42 | 2.37 | 2.41 | 2.40 |
| Dielectric dissipation factor (1.0 GHz) | 0.0056 | 0.0064 | 0.0058 | 0.0052 |
| Formability | ○ | ○ | ○ | ○ |

Example 10

The copolymer A, PPE, OPE-2St-1, the thermoplastic resin T-1, the halogen-based flame retardant F-1, the halogen-based flame retardant F-5, and the layered silicate LS-1 were mixed in amounts described in Table 11 with toluene as a solvent. The mixture was stirred, and the reaction initiator P-1 and the curing catalyst C-1 were added, to thereby prepare a solution of a flame retardant resin composition.

The solution of a flame retardant resin composition was cast on a board having a polyethylene terephthalate (PET) resin sheet attached, to thereby obtain a film. The obtained film had a thickness of about 50 to 60 μm, was not sticky and the like, and had excellent film formation property. This film was dried at 80° C. for 10 minutes in an air oven, and heat-cured at 180° C. for 1 hour with a vacuum press forming machine, to thereby obtain a cured film having a thickness of about 50 μm.

This cured film was measured for tensile strength, stretch rate, dielectric constant, dielectric dissipation factor, average interlayer distance of the layered silica, ratio P (%) of the layered silicate dispersed as a laminate of five or less layers, flame retardance, surface properties, and formability.

Example 11

The copolymer B, PPE, OPE-2St-1, the thermoplastic resin T-2, the halogen-based flame retardant F-1, the halogen-based flame retardant F-5, and the layered silicate H-1 were mixed in amounts described in Table 11 with toluene as a solvent. The mixture was stirred, and the reaction initiator P-1 and the curing catalyst C-2 were added, to thereby prepare a solution of a flame retardant resin composition.

The obtained solution of a heat-curable resin composition was cast on a PET sheet, to thereby form a film having a thickness of about 15 μm. Then, a PET sheet was laminated on the cast surface, and the whole was cured in an air oven at 180° C., to thereby obtain a cured film.

Example 12

A cured film was obtained from a flame retardant resin composition in the same manner as in Example 10 except that the addition amount of the flame retardant was changed and the heat-curable resin E-7 was added.

Example 13

A cured film was obtained from a flame retardant resin composition in the same manner as in Example 12 except that the heat-curable resin E-1 was added.

Table 11 shows the mixing composition and the evaluation results.

TABLE 11

| | Example | | | |
|---|---|---|---|---|
| | 10 | 11 | 12 | 13 |
| Copolymer A (wt %) | 10.0 | 9.0 | 9.0 | 9.0 |
| OPE-2St-1 (wt %) | 27.0 | 25.5 | 25.5 | 25.5 |
| PPE (wt %) | 2.5 | 2.5 | 2.5 | 2.5 |
| T-1 (wt %) | 34.0 | | 34.0 | 34.0 |
| T-2 (wt %) | | 34.0 | | |
| E-7 (wt %) | | | 1.0 | |
| E-1 (wt %) | | | | 1.0 |
| F-1 (wt %) | 20.0 | 20.0 | 20.0 | 20.0 |
| F-5 (wt %) | 4.0 | 4.0 | 3.0 | 3.0 |
| LS-1 (wt %) | 2.5 | 5.0 | 5.0 | 5.0 |
| P-1 (phr) | 3.0 | 3.0 | 3.0 | 3.0 |
| C-1 (phr) | 0.08 | | 0.08 | 0.08 |
| C-2 (phr) | | 0.08 | | |
| Average interlayer distance (nm) | 3.5< | 3.5< | 3.5< | 3.5< |
| P (%) | 10< | 10< | 10< | 10< |
| Tensile strength (kgf/mm$^2$) | 3.51 | 3.67 | 3.38 | 3.42 |
| Stretch at tensile break (%) | 19.5 | 11.3 | 15.7 | 21.4 |
| Tensile modulus of elasticity (kgf/mm$^2$) | 77.2 | 81.6 | 84.7 | 84.7 |
| Copper foil peeling strength (kgf/cm) | 1.01 | 0.97 | 0.87 | 1.05 |
| Glass transition temperature (° C.) | 208.6 | 202.4 | 204.3 | 206.2 |
| Softening temperature (° C.) | >300 | >300 | >300 | >300 |
| Dielectric constants (1.0 GHz) | 2.39 | 2.41 | 2.52 | 2.56 |
| Dielectric dissipation factor (1.0 GHz) | 0.0043 | 0.0037 | 0.0046 | 0.0052 |
| Flame retardance (UL94) | VTMO | VTMO | VTMO | VTMO |
| Surface properties | Δ | Δ | Δ | Δ |
| Formability | ○ | ○ | ○ | ○ |

Comparative Examples 3 to 6

The evaluation was performed in the same manner as in Example 10 except that a film having a thickness of about 15 μm was formed by casting, on a PET sheet, a solution of a flame retardant resin composition prepared by: mixing the copolymer A, PPE, OPE-2St-1, the thermoplastic resin T-1, the halogen-based flame retardant F-1, the halogen-based flame retardant F-5, the layered silicate H-1, and calcium carbonate having an average particle size of 50 μm in amounts described in Table 12 with toluene as a solvent; stirring the whole; and adding the reaction initiator P-1 and the curing catalyst C-1. Table 12 shows the results.

TABLE 12

| | Comparative Example | | | |
|---|---|---|---|---|
| | 3 | 4 | 5 | 6 |
| Copolymer A (wt %) | 10.0 | 6.5 | 10.0 | 8.0 |
| OPE-2St-1 (wt %) | 27.0 | 19.0 | 27.0 | 21.5 |
| PPE (wt %) | 2.5 | 1.5 | 2.5 | 1.5 |
| T-1 (wt %) | 34.0 | 29.0 | 34.0 | 25.0 |
| T-2 (wt %) | | | | |
| E-7 (wt %) | | 4.0 | | |
| E-1 (wt %) | | | | |
| F-1 (wt %) | 22.5 | 40.0 | 20.0 | 20.0 |
| F-5 (wt %) | 4.0 | | 4.0 | 4.0 |
| LS-1 (wt %) | | | | |
| Calcium carbonate (wt %) | | | 5.0 | 20.0 |
| P-1 (phr) | 3.0 | 3.0 | 3.0 | 3.0 |
| C-1 (phr) | 0.08 | 0.08 | 0.08 | 0.08 |
| Average interlayer distance (nm) | | | | |
| P (%) | | | | |
| Tensile strength (kgf/mm$^2$) | 1.89 | 1.56 | 1.86 | 1.81 |
| Stretch at tensile break (%) | 21.8 | 8.7 | 6.5 | 4.8 |
| Tensile modulus of elasticity (kgf/mm$^2$) | 44.5 | 45.9 | 47.3 | 45.6 |
| Copper foil peeling strength (kgf/cm) | 0.54 | 0.48 | 0.61 | 0.57 |
| Glass transition temperature (° C.) | 121.9 | 125.2 | 124.3 | 126.3 |
| Softening temperature (° C.) | 128.9 | 130.8 | 129.1 | 131.3 |
| Dielectric constants (1.0 GHz) | 2.51 | 2.58 | 2.78 | 2.77 |
| Dielectric dissipation factor (1.0 GHz) | 0.0052 | 0.0056 | 0.0055 | 0.0048 |
| Flame retardance (UL94) | NG | NG | NG | NG |
| Surface properties | x | x | x | x |
| Formability | ○ | ○ | ○ | ○ |

Comparative Examples 7 to 10

The evaluation was performed in the same manner as in Example 10 except that a film having a thickness of about 15 μm was formed by casting, on a PET sheet, a solution of a flame retardant resin composition prepared by: mixing the copolymer A, PPE, OPE-2St-1, the thermoplastic resin T-1, a brominated polystyrene having a syndiotactic structure (bromine content: 51%, syndiotacticity: 95% or more, number average molecular weight: 670,000, Mw/Mn: 2.75) as the halogen-based flame retardant F-6, hexabromocyclododecane (Firemaster CD-75P, available from Great Lakes Chemical Corporation) as the halogen-based flame retardant F-7, the layered silicate LS-1, and calcium carbonate having an average particle size of 50 μm in amounts described in Table 13 with toluene as a solvent; stirring the whole; and adding the reaction initiator P-1 and the curing catalyst C-1. Table 13 shows the results.

TABLE 13

| | Comparative Example | | | |
|---|---|---|---|---|
| | 7 | 8 | 9 | 10 |
| Copolymer A (wt %) | 10.0 | 6.5 | 10.0 | 8.0 |
| OPE-2St-1 (wt %) | 27.0 | 19.0 | 27.0 | 21.5 |
| PPE (wt %) | 2.5 | 1.5 | 2.5 | 1.5 |
| T-1 (wt %) | 34.0 | 29.0 | 34.0 | 25.0 |
| E-7 (wt %) | | 4.0 | | |
| F-6 (wt %) | 36.5 | 40.0 | | |
| F-7 (wt %) | | | 25.0 | 35.0 |
| F-5 (wt %) | 4.0 | 4.0 | 4.0 | 4.0 |
| LS-1 (wt %) | 5.0 | 5.0 | 5.0 | 5.0 |
| P-1 (phr) | 3.0 | 3.0 | 3.0 | 3.0 |
| C-1 (phr) | 0.08 | 0.08 | 0.08 | 0.08 |
| Average interlayer distance (nm) | 3.5< | 3.5< | 3.5< | 3.5< |
| P (%) | 10< | 10< | 10< | 10< |
| Tensile strength (kgf/mm$^2$) | 2.47 | 2.32 | 2.62 | 2.55 |
| Stretch at tensile break (%) | 4.8 | 3.5 | 7.5 | 4.1 |
| Tensile modulus of elasticity (kgf/mm$^2$) | 104.6 | 117.8 | 58.6 | 61.2 |
| Copper foil peeling strength (kgf/cm) | 0.49 | 0.42 | 0.53 | 0.46 |
| Glass transition temperature (° C.) | 189.0 | 181.7 | 176.9 | 177.4 |
| Softening temperature (° C.) | >300 | >300 | >300 | >300 |
| Dielectric constants (1.0 GHz) | 2.59 | 2.56 | 2.71 | 2.73 |
| Dielectric dissipation factor (1.0 GHz) | 0.0065 | 0.0061 | 0.0070 | 0.0072 |
| Flame retardance (UL94) | NG | NG | NG | NG |
| Surface properties | x | x | x | x |
| Formability | x | x | x | x |

Example 14

The evaluation was performed in the same manner as in Example 10 except that a cured film having a thickness of about 50 μm was obtained by: using swelling fluorine mica-1 subjected to organification treatment with a distearyidimethyl quaternary ammonium salt (Somasif MAE-100, available from CO-OP Chemical Co., Ltd.) as the layered silicate H-2, and natural montmorillonite-1 subjected to organification treatment with a distearyidimethyl quaternary ammonium salt (New S-Ben D, available from Hojun Co., Ltd.) was used as the layered silicate H-3; casting a solution of a heat-curable resin composition on a polyethylene terephthalate resin (PET) sheet; drying the obtained film (thickness of about 50 μm to 60 μm) at 80° C. for 10 minutes in an air oven; and heat-curing the resultant at 180° C. for 1 hour with a vacuum press forming machine. Table 14 shows the mixing composition and the evaluation results.

TABLE 14

| | Experiment No. | | | |
|---|---|---|---|---|
| | 5 | 6 | 7 | 8 |
| Copolymer A (wt %) | 8.0 | 8.0 | 8.0 | 8.0 |
| OPE-2St-1 (wt %) | 23.5 | 23.5 | 23.5 | 23.5 |
| PPE (wt %) | 1.5 | 1.5 | 1.5 | 1.5 |
| T-1 (wt %) | 31.0 | 31.0 | 31.0 | 31.0 |
| E-7 (wt %) | 4.0 | | 4.0 | |
| E-1 (wt %) | | 4.0 | | 4.0 |
| F-2 (wt %) | 26.0 | 26.0 | 26.0 | 26.0 |
| F-5 (wt %) | 1.0 | 1.0 | 1.0 | 1.0 |
| LS-2 (wt %) | 5.0 | 5.0 | | |
| LS-3 (wt %) | | | 5.0 | 5.0 |
| P-1 (phr) | 3.0 | 3.0 | 3.0 | 3.0 |
| C-1 (phr) | 0.08 | 0.08 | 0.08 | 0.08 |
| Average interlayer distance (nm) | 3.5< | 3.5< | 3.5< | 3.5< |
| P (%) | 10< | 10< | 10< | 10< |
| Tensile strength (kgf/mm$^2$) | 3.44 | 3.51 | 3.37 | 3.56 |
| Stretch at tensile break (%) | 18.5 | 19.7 | 17.3 | 18.1 |
| Tensile modulus of elasticity (kgf/mm$^2$) | 78.3 | 82.6 | 79.3 | 81.7 |
| Copper foil peeling strength (kgf/cm) | 1.02 | 1.07 | 0.96 | 1.01 |
| Glass transition temperature (° C.) | 206.4 | 203.1 | 207.2 | 204.2 |
| Softening temperature (° C.) | >300 | >300 | >300 | >300 |
| Dielectric constants (1.0 GHz) | 2.39 | 2.42 | 2.39 | 2.47 |
| Dielectric dissipation factor (1.0 GHz) | 0.0037 | 0.0045 | 0.0041 | 0.0050 |
| Flame retardance (UL94) | VTMO | VTMO | VTMO | VVTMO |
| Surface properties | ○ | ○ | ○ | ○ |
| Formability | ○ | ○ | ○ | ○ |

Example 15

The evaluation was performed in the same manner as in Example 10 except that the copolymer B, the thermoplastic resin T-6, the thermoplastic resin T-7, the thermoplastic resin T-5, the heat-curable resin E-3, the heat-curable resin E-5, the heat-curable resin E-5, the halogen-based flame retardant F-3, the halogen-based flame retardant F-4, and the inorganic flame retardant M-1 were used. Table 15 shows the results.

TABLE 15

|  | Experiment No. | | | |
|---|---|---|---|---|
|  | 13 | 14 | 15 | 16 |
| Copolymer B (wt %) | 10.0 | 7.0 | 8.0 | 10.0 |
| OPE-2St-1 (wt %) | 21.5 | 20.5 | 23.5 | 22.5 |
| PPE (wt %) | 1.5 | 1.5 | 1.5 | 1.5 |
| T-6 (wt %) | 26.0 |  | 26.0 |  |
| T-7 (wt %) | 5.0 |  | 5.0 |  |
| T-4 (wt %) |  | 31.0 |  | 30.0 |
| E-4 (wt %) | 4.0 |  |  | 3.0 |
| E-5 (wt %) |  | 4.0 |  |  |
| E-6 (wt %) |  |  | 4.0 |  |
| F-1 (wt %) | 27.0 |  |  |  |
| F-3 (wt %) |  | 31.0 |  | 23.0 |
| F-4 (wt %) |  |  | 27.0 |  |
| LS-1 (wt %) | 5.0 | 5.0 | 5.0 | 5.0 |
| M-1 (wt %) |  |  |  | 5.0 |
| P-1 (phr) | 3.0 | 3.0 | 3.0 | 3.0 |
| C-1 (phr) | 0.08 | 0.08 | 0.08 | 0.08 |
| Average interlayer distance (nm) | 3.5< | 3.5< | 3.5< | 3.5< |
| P (%) | 10< | 10< | 10< | 10< |
| Tensile strength (kgf/mm$^2$) | 3.57 | 3.18 | 3.62 | 3.41 |
| Stretch at tensile break (%) | 24.6 | 18.4 | 22.1 | 15.4 |
| Tensile modulus of elasticity (kgf/mm$^2$) | 96.0 | 79.0 | 77.6 | 80.9 |
| Copper foil peeling strength (kgf/cm) | 1.06 | 1.00 | 0.99 | 1.02 |
| Glass transition temperature (° C.) | 204.9 | 201.6 | 208.1 | 203.7 |
| Softening temperature (° C.) | >300 | >300 | >300 | >300 |
| Dielectric constants (1.0 GHz) | 2.38 | 2.56 | 2.52 | 2.57 |
| Dielectric dissipation factor (1.0 GHz) | 0.0041 | 0.0051 | 0.0055 | 0.0053 |
| Flame retardance (UL94) | VTM0 | VTM0 | VTM0 | VTM0 |
| Surface properties | ◯ | ◯ | ◯ | ◯ |
| Formability | ◯ | ◯ | ◯ | ◯ |

Example 16

A glass cloth (E glass, weight of 71 g/m$^2$) was dipped in the solution of the resin composition obtained in Example 11 for impregnation, and the whole was dried in an air oven at 60° C. for 30 minutes. The obtained prepreg had a resin content (R.C) of 69%.

Core materials each having through-holes with a diameter of 0.35 mm arranged at 5 mm pitch and having a thickness of 0.8 mm were attached by using this prepreg, and the number of through-holes without the resin filled therein was 0 out of 4,500 holes.

A plurality of the curable composite materials were piled as required such that a thickness after forming was about 0.6 mm to 1.0 mm. A copper foil having a thickness of 35 μm was placed on each side of the pile, and the whole was formed and cured with a press forming machine, to thereby obtain a laminate. The curing conditions for each of Examples include: a temperature increase rate of 3° C./minute; holding at 180° C. for 60 minutes; and a pressure of 30 kg/cm$^2$.

The physical properties of the thus-obtained laminate were measured through the above-mentioned methods.

No changes in appearance of the laminate were observed in the trichloroethylene resistance test. The laminate had Tg of 209° C. No changes in appearance of the laminate were observed in the solder heat resistance test. The laminate had a dielectric constant of 2.65 and a dielectric dissipation factor of 0.0023.

Example 17

The evaluation was performed in the same manner as in Example 10 except that melamine phosphate (P-7202, trade name, available from Sanwa Chemical Co., Ltd., flame retardant G-1), melamine pyrophsphate (MPP-A, trade name, available from Sanwa Chemical Co., Ltd., flame retardant G-2), melamine cyanurate (MC-440, available from Nissan Chemical Industries, Ltd., flame retardant G-3), and hexaphenoxycyclotriphosphazene (SPB-100, available from Otsuka Chemical Co., Ltd., flame retardant G-4) were used. Table 16 shows the mixing composition and the evaluation results.

TABLE 16

|  | Experiment No. | | | |
| --- | --- | --- | --- | --- |
|  | 18 | 19 | 20 | 21 |
| Copolymer A (wt %) | 8.0 | 8.0 | 8.0 | 8.0 |
| OPE-2St-1 (wt %) | 23.5 | 23.5 | 23.5 | 23.5 |
| PPE (wt %) | 1.5 | 1.5 | 1.5 | 1.5 |
| T-1 (wt %) | 31.0 | 31.0 | 31.0 | 31.0 |
| E-1 (wt %) | 4.0 | 4.0 | 4.0 | 4.0 |
| F-2 (wt %) | 24.0 | 24.0 | 24.0 | 24.0 |
| F-5 (wt %) | 1.0 | 1.0 | 1.0 | 1.0 |
| G-1 (wt %) | 2.0 | | | |
| G-2 (wt %) | | 2.0 | | |
| G-3 (wt %) | | | 2.0 | |
| G-4 (wt %) | | | | 2.0 |
| LS-2 (wt %) | 5.0 | 5.0 | | |
| LS-3 (wt %) | | | 5.0 | 5.0 |
| P-1 (phr) | 3.0 | 3.0 | 3.0 | 3.0 |
| C-1 (phr) | 0.08 | 0.08 | 0.08 | 0.08 |
| Average interlayer distance (nm) | 3.5< | 3.5< | 3.5< | 3.5< |
| P (%) | 10< | 10< | 10< | 10< |
| Tensile strength (kgf/mm$^2$) | 3.04 | 3.05 | 2.97 | 2.12 |
| Stretch at tensile break (%) | 13.2 | 12.1 | 13.6 | 11.2 |
| Tensile modulus of elasticity (kgf/mm$^2$) | 81.3 | 83.6 | 79.2 | 76.8 |
| Copper foil peeling strength (kgf/cm) | 0.91 | 0.84 | 0.88 | 0.95 |
| Glass transition temperature (° C.) | 204.2 | 205.6 | 203.1 | 203.3 |
| Softening temperature (° C.) | >300 | >300 | >300 | >300 |
| Dielectric constants (1.0 GHz) | 2.51 | 2.54 | 2.49 | 2.57 |
| Dielectric dissipation factor (1.0 GHz) | 0.0056 | 0.0066 | 0.0063 | 0.0057 |
| Flame retardance (UL94) | VTMO | VTMO | VTMO | VTMO |
| Surface properties | ○ | ○ | ○ | ○ |
| Formability | ○ | ○ | ○ | ○ |

INDUSTRIAL APPLICABILITY

The curable-resin composition of the present invention has excellent chemical resistance, dielectric properties, low water absorbing property, heat resistance, flame retardance, and mechanical properties after curing. The curable resin composition containing a layered silicate has favorable curing properties, heat resistance, dielectric properties, formability, and mechanical properties even as a thin formed product. The flame retardant curable resin composition containing a layered silicate and a flame retardant has a high level of flame retardance, and favorable appearance, forming workability, curing properties, dielectric properties, heat resistance, and heat hydrolysis resistance without including an antimony compound such as antimony trioxide even as a thin formed product or cured product. Thus, the curable resin composition of the present invention may be used for a dielectric material, insulating material, heat resistant material, structural material, or the like in fields of electronics industry, aerospace industry, and the like. In particular, the curable resin composition of the present invention may be used on one side or both sides of a multilayer printed-wiring board, a flexible printed-wiring board, a build up substrate, or the like.

The invention claimed is:

1. A curable resin composition comprising:

a component (A) which is a polyphenylene ether oligomer having a number average molecular weight Mn of 700 to 4,000, having a vinyl group on each terminal, and represented by the formula (1):

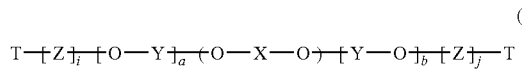
(1)

wherein: Z represents an organic group which has one or more carbon atoms and which may have an oxygen atom; T represents a vinyl group; a and b each represent an integer of 0 to 20 and at least one of a and b is not 0; i and j each independently represent an integer of 0 or 1; —(O—X—O)— is represented by the formula (2); and —(Y—O)— represents one or more structures represented by the formula (3):

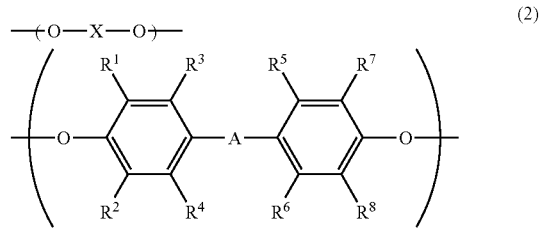
(2)

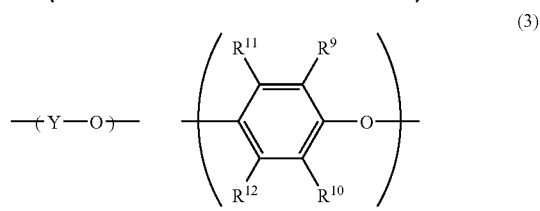
(3)

wherein: A represents a single bond or a linear, branched, or cyclic hydrocarbon group having 20 or less carbon atoms; $R^1$, $R^2$, $R^7$, $R^8$, $R^9$, and $R^{10}$ each independently represent a halogen atom, an alkyl group having 6 or less carbon atoms, or a phenyl group; and $R^3$, $R^4$, $R^5$, $R^6$, $R^{11}$, and $R^{12}$ each independently represent a hydrogen atom, a halogen atom, an alkyl group having 6 or less carbon atoms, or a phenyl group; and a component (B) which is a solvent-soluble polyfunctional vinyl aromatic copolymer having an indan structure represented by the following general formula (4) in a main chain skeleton of the polyfunctional vinyl aromatic copolymer:

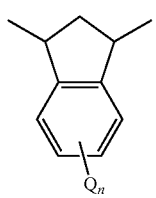

(4)

wherein: Q represents a saturated or unsaturated aliphatic hydrocarbon group, an aromatic hydrocarbon group, an aromatic ring condensed to a benzene ring, or a substituted aromatic ring; and n represents an integer of 0 to 4 and structural units derived from monomers each formed of a divinyl aromatic compound (a) and an ethylvinyl aromatic compound (b), having a repeating unit derived from the divinyl aromatic compound (a) of 20 mol% or more, having a mole fraction of structural units having a vinyl group derived from the divinyl aromatic compound (a) and represented by the following formulae (a1) and (a2):

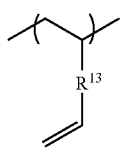

(a1)

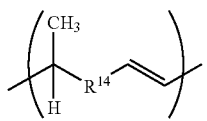

(a2)

wherein: $R^{13}$ represents an aromatic hydrocarbon group having 6 to 30 carbon atoms; and $R^{14}$ represents an aromatic hydrocarbon group having 6 to 30 carbon atoms, the mole fraction satisfying the expression $(a1)/[(a1)+(a2)] \geqq 0.5$, having a number average molecular weight (Mn) measured through gel permeation chromatography (GPC) of 600 to 30,000 calculated by standard polystyrene samples with narrow molecular weight distribution, and having a ratio (Mw/Mn) of a weight average molecular weight (Mw) and the number average molecular weight (Mn) of 20.0 or less, the curable resin composition being characterized in that:

a mixing amount of the component (A) is 20 to 98 wt % with respect to a total amount of the component (A) and the component (B).

2. A curable resin composition according to claim 1, characterized in that the component (B) comprises a soluble polyfunctional vinyl aromatic copolymer having a structural unit derived from a monovinyl aromatic compound (c) except the ethylvinyl aromatic compound (b) in the polyfunctional vinyl aromatic copolymer.

3. A curable resin composition according to claim 1, further comprising a component (C) which is a thermoplastic resin in addition to the component (A) and the component (B), wherein a mixing amount of the component (C) is 2 to 60 wt % with respect to a total amount of the component (A), the component (B), and the component (C).

4. A curable resin composition according to claim 3, wherein the thermoplastic resin as the component (C) comprises one or more kinds of thermoplastic resins selected from the group consisting of a block copolymer having a polymer segment with a glass transition temperature of 20° C. or lower, and polyphenylene ether.

5. A curable resin composition according to claim 3, further comprising a component (D) which is a thermosetting resin in addition to the component (A), the component (B), and the component (C), wherein a mixing amount of the component (D) is 2 to 40 wt % with respect to a total amount of the component (A), the component (B), the component (C), and the component (D).

6. A curable resin composition according to claim 5, wherein the thermosetting resin as the component (D) comprises one or more kinds of thermosetting resins selected from the group consisting of thermosetting polyphenylene ether, a polyphenylene ether oligomer having a functional group on each terminal different from the functional group of the component (A), and a polyfunctional epoxy compound.

7. A curable resin composition according to claim 5, further comprising a component (E) which is a filler in addition to the component (A), the component (B), the component (C), and the component (D), wherein a mixing amount of the component (E) is 2 to 90 wt % with respect to a total amount of the component (A), the component (B), the component (C), the component (D), and the component (E).

8. A curable resin composition according to claim 1, characterized by further comprising a component (J) which is a layered silicate, wherein a mixing amount of the component (J) is 0.1 to 98 wt %.

9. A curable resin composition according to claim 8, wherein the component (J) comprises a swelling layered silicate having affinity to an organic solvent.

10. A flame retardant curable resin composition, characterized by comprising a component (J) which is a layered silicate and a component (K) which is a halogenated flame retardant in the curable resin composition according to claim 1, wherein: a mixing amount of the component (J) is 0.1 to 95.9 wt %; and a mixing amount of the component (K) is 0.1 to 95.9 wt %.

11. A flame retardant curable resin composition according to claim 10, wherein:
the component (J) comprises at least one layered silicate selected from the group consisting of montmorillonite, swelling mica, and hectorite; and
the component (K) comprises one or more kinds of halogenated flame retardants selected from the group consisting of decabromodiphenyl oxide, octabromodiphenyl oxide, tetrabromodiphenyl oxide, ethane-1,2-bis(pentabromophenyl), bis(2,4,6-tribromophenoxy)ethane, ethylenebistetrabromophthalimide, polydibromophenylene oxide, tetrabromobisphenol-S, 1,1-sulfonyl[3,5-dibromo-4-(2,3-dibromopropoxy)]benzene, tris(2,3-dibromopropyl-1)isocyanurate, tris(tribromophenyl)cyanurate, a brominated polystyrene having an atactic structure, a brominated styrene-methyl methacrylate-based copolymer having an atactic structure, a brominated styrene-methyl methacrylate-diglycidyl methacrylate-based copolymer having an atactic structure, a brominated styrene-glycidyl methacrylate-based copolymer having an atactic structure, a brominated styrene-polypropylene-based copolymer having an atactic structure, a brominated polyethylene, tetrabrombisphenol-A, a tetrabrombisphenyl-A-epoxy oligomer, a brominated epoxy compound, a tetrabrombisphenol-A-carbonate oligomer, tetrabrombisphenol-A-bis(2-hydroxydiethyl ether), tetrabrombisphenol-A-bis(2,3-dibromopropyl ether), poly(pentabromobenzyl acrylate), and octabromotrimethylphenylindane.

12. A curable resin composition according to claim 10, characterized in that the component (J) has an average interlayer distance of a (001) plane of 3 nm or more measured through a wide angle X-ray diffraction measurement method, and is partly or entirely dispersed in five or less layers.

13. A film which is obtained by forming the curable resin composition according to claim 1 into a film.

14. A curable composite material comprising the curable resin composition according to claim 1 and a substrate, characterized in that the substrate is included in a ratio of 5 to 90 wt %.

15. A cured composite material which is obtained by curing the curable composite material according to claim 14.

16. A laminate characterized by comprising a layer of the cured composite material according to claim 14 and a metal foil layer.

17. A resin coated metal foil characterized by comprising a film formed of the curable resin composition according to claim 1 on one side of a metal foil.

\* \* \* \* \*